United States Patent [19]

Imai et al.

[11] Patent Number: 6,057,247
[45] Date of Patent: May 2, 2000

[54] METHOD FOR FABRICATING SEMICONDUCTOR DEVICE AND METHOD FOR CONTROLLING ENVIRONMENT INSIDE REACTION CHAMBER OF DRY ETCHING APPARATUS

[75] Inventors: Shinichi Imai; Nobuhiro Jiwari, both of Osaka, Japan

[73] Assignee: Matsushita Electronics Corporation, Osaka, Japan

[21] Appl. No.: 09/179,936

[22] Filed: Oct. 28, 1998

[30] Foreign Application Priority Data

Oct. 29, 1997 [JP] Japan .................................. 9-296923
Nov. 5, 1997 [JP] Japan .................................. 9-302532

[51] Int. Cl.[7] .................................................. H01L 21/00
[52] U.S. Cl. .............................. 438/714; 438/9; 438/723; 438/734; 438/743; 156/345
[58] Field of Search ................................ 438/9, 714, 723, 438/734, 743; 156/345 P, 345 MT

[56] References Cited

U.S. PATENT DOCUMENTS 5,858,878  1/1999  Toda .................................... 438/723 X
5,880,019  3/1999  Hsieh et al. ........................ 438/723 X

FOREIGN PATENT DOCUMENTS 6-244152  9/1994  Japan .
8-92768   4/1996  Japan .

*Primary Examiner*—William Powell
*Attorney, Agent, or Firm*—McDermott, Will & Emery

[57] ABSTRACT

A method for fabricating a semiconductor device according to the present invention includes the steps of: forming an oxide film on a substrate having a silicon region at least on the surface thereof; defining a resist pattern on the oxide film; placing the substrate on an electrode provided inside a reaction chamber of a plasma etching apparatus, and etching the oxide film by using plasma generated from a gas including a fluorocarbon gas with a bias voltage applied to the substrate; and removing fluorine from the reaction chamber by generating oxygen plasma inside the reaction chamber with substantially no bias voltage applied to the substrate.

35 Claims, 29 Drawing Sheets

METHOD FOR FABRICATING SEMICONDUCTOR DEVICE AND METHOD FOR CONTROLLING ENVIRONMENT INSIDE REACTION CHAMBER OF DRY ETCHING APPARATUS

BACKGROUND OF THE INVENTION

The present invention relates to a method for fabricating a semiconductor device, and more particularly relates to a method for fabricating a semiconductor device including the process step of dry-etching a silicon dioxide film.

As a semiconductor device has been downsized, the size of a contact has been reduced, but the thickness of an interlevel dielectric film has not. Accordingly, the ratio of the thickness of an interlevel dielectric film to the size of a contact (i.e., an aspect ratio) has considerably increased recently. In view of these circumstances, it is important to establish some technique of forming a contact hole with a high aspect ratio by etching.

In order to form a contact hole with a high aspect ratio by etching, dry etching technique using plasma including fluorocarbon gas, in which the ratio of fluorine to carbon per molecule is relatively small, has been vigorously researched and developed.

However, in the case of forming a contact hole by using plasma including fluorocarbon gas of such a type, if the selectivity with respect to a photoresist is set higher, then a polymer film mainly composed of carbon and fluorine is deposited on the bottom of such a contact hole. If a contact is formed by filling in the contact hole with a conductive member without removing such a polymer film, then the resulting contact cannot exhibit satisfactory characteristics. In order to cope with such a problem, various methods for removing such a polymer film by using oxygen plasma have been proposed. However, the present inventors found that if oxygen plasma processing is performed to remove a polymer film from the bottom of a contact hole, then resulting contact resistance increases to the contrary. Also, when a contact hole is formed in a silicon dioxide film by using a fluorocarbon gas such as $C_4F_8$, the depth of a contact hole that can be formed on the same etching conditions (hereinafter, such a depth will be referred to as an "etching depth") adversely decreases as the number of wafers etched increases.

SUMMARY OF THE INVENTION

In view of these problems, the present invention was made in order to provide a method for fabricating a semiconductor device, including a step enabling the removal of a polymer film deposited on the bottom of a contact hole with the increase of contact resistance reduced. Another object of the present invention is providing a method for controlling the environment inside a reaction chamber of a dry etching apparatus.

According to the present invention, a method for fabricating a semiconductor device is provided. The method includes the steps of: forming an oxide film on a substrate having a silicon region at least on the surface thereof; defining a resist pattern on the oxide film; placing the substrate on an electrode provided inside a reaction chamber of a plasma etching apparatus, and etching the oxide film by using plasma generated from a gas including a fluorocarbon gas, with a bias voltage applied to the substrate; and removing fluorine from the reaction chamber by generating oxygen plasma inside the reaction chamber with substantially no bias voltage applied to the substrate.

Another method for fabricating a semiconductor device according to the present invention includes the steps of: forming a semiconductor element on a substrate; depositing a silicon dioxide film on the substrate; defining a photoresist pattern on the silicon dioxide film; etching the silicon dioxide film by using gaseous plasma inside a reaction chamber of an etching apparatus, the ratio of fluorine to carbon contained in the gaseous plasma being two or less; and controlling an environment inside the reaction chamber by oxidizing a polymer film formed on an inner wall of the reaction chamber.

According to the present invention, a method for controlling an environment inside a reaction chamber of a dry etching apparatus is also provided. The apparatus is used for performing the step of dry-etching a silicon dioxide film inside the reaction chamber by using gaseous plasma in which the ratio of fluorine to carbon is 2 or less. In accordance with this method, oxygen plasma processing is performed on a polymer film formed on an inner wall of the reaction chamber while the step of dry etching is not performed.

DESCRIPTION OF THE PREFERRED EMBODIMENTS

The present inventors found that contact resistance increases because a diffusion layer is excessively etched, and that such excessive etching proceeds because fluorine, remaining inside a reaction chamber, reaches a silicon substrate during oxygen plasma processing. We also found that fluorine is supplied from a polymer film, deposited on the inner wall of the reaction chamber, into the oxygen plasma.

Hereinafter, this phenomenon will be described with reference to FIGS. 1A through 1D. FIGS. 1A through 1D are model diagrams showing why a diffusion layer is etched by fluorine in oxygen plasma.

Figure 1A:
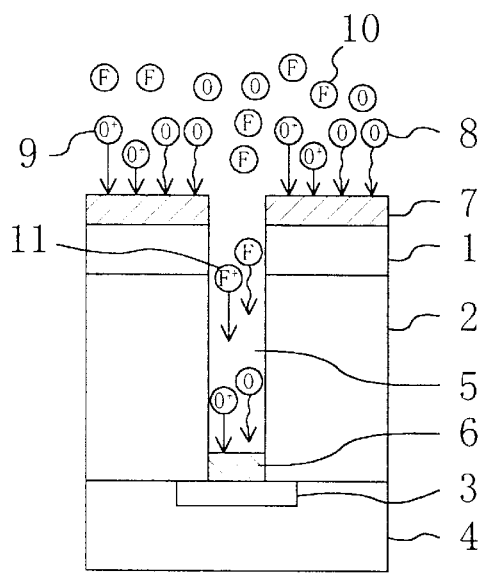
FIGS. 1A through 1D are diagram illustrating a principle on which a diffusion layer is etched by fluorine.

FIG. 1A illustrates a cross section of a silicon substrate 4 on which a contact hole 5 has been formed in a silicon dioxide film 2 by dry etching. A resist pattern 1 has been defined on the silicon dioxide film 2. Polymer films 6 and 7 have been deposited on the surface of the resist pattern 1 and on the bottom of the contact hole 5, respectively. These polymer films 6 and 7 are formed during etching the silicon dioxide film 2. In order to remove the polymer film 6 from the bottom of the contact hole 5, oxygen plasma is generated inside a reaction chamber of an etching apparatus and a bias voltage is applied to the silicon substrate 4. FIG. 1A illustrates a state in which the discharge of oxygen plasma has just been started in order to remove the polymer film 6.

As shown in FIG. 1A, not only oxygen 8 and oxygen ions 9, but also fluorine 10 and fluorine ions 11 exist in oxygen plasma. Fluorine 10 was presumably attached to the inner wall of the reaction chamber during etching the contact hole 5 and then dissociated itself from the wall.

Upon the application of a bias voltage to the silicon substrate 4, the polymer films 6 and 7 start to be etched by oxygen 8 and the oxygen ions 9. As shown in FIG. 1B, when the polymer film 6 is completely removed from the bottom of the contact hole 5, the diffusion layer 3 starts to be etched by fluorine 10 and the fluorine ions 11.

Even while oxygen plasma is being generated, oxygen gas is continuously supplied into the reaction chamber of the etching apparatus and the exhaustion from the reaction chamber is also continuously performed. Accordingly, the amount of fluorine existing inside the reaction chamber gradually decreases.

Figure 1C:
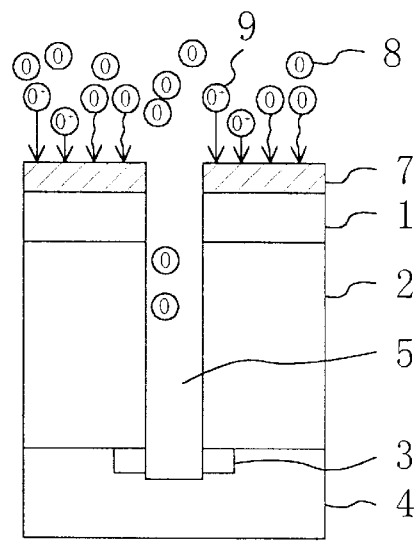
Figure 1B:
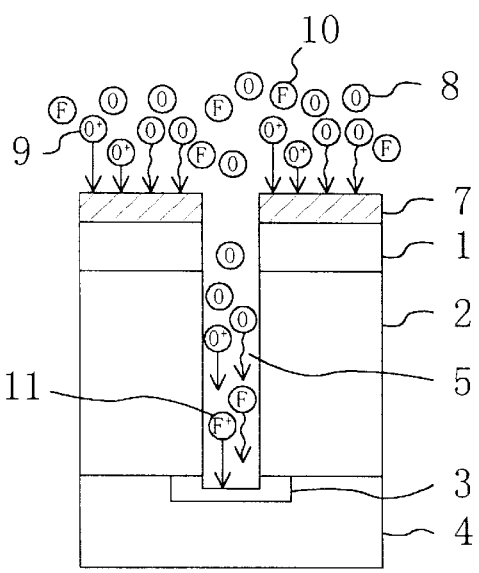
Figure 1D:
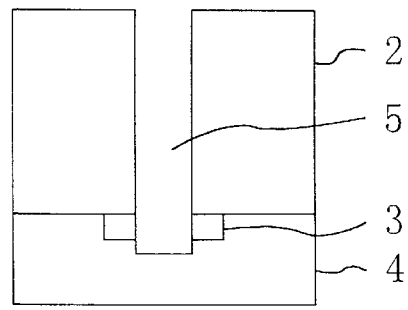

As shown in FIG. 1C, when fluorine completely disappears from the oxygen plasma, the diffusion layer 3 stops being etched and only the polymer film 7 is continuously etched by oxygen 8 and the oxygen ions 9. As a result, the polymer film 7 is also completely removed as shown in FIG. 1D.

In this manner, during the process step of removing the polymer film 6 from the bottom of the contact hole 5 by using oxygen plasma, fluorine 10 and the fluorine ions 11 in the oxygen plasma unintentionally etch the diffusion layer 3 deep. As a result, the contact resistance considerably increases.

Figure 2:
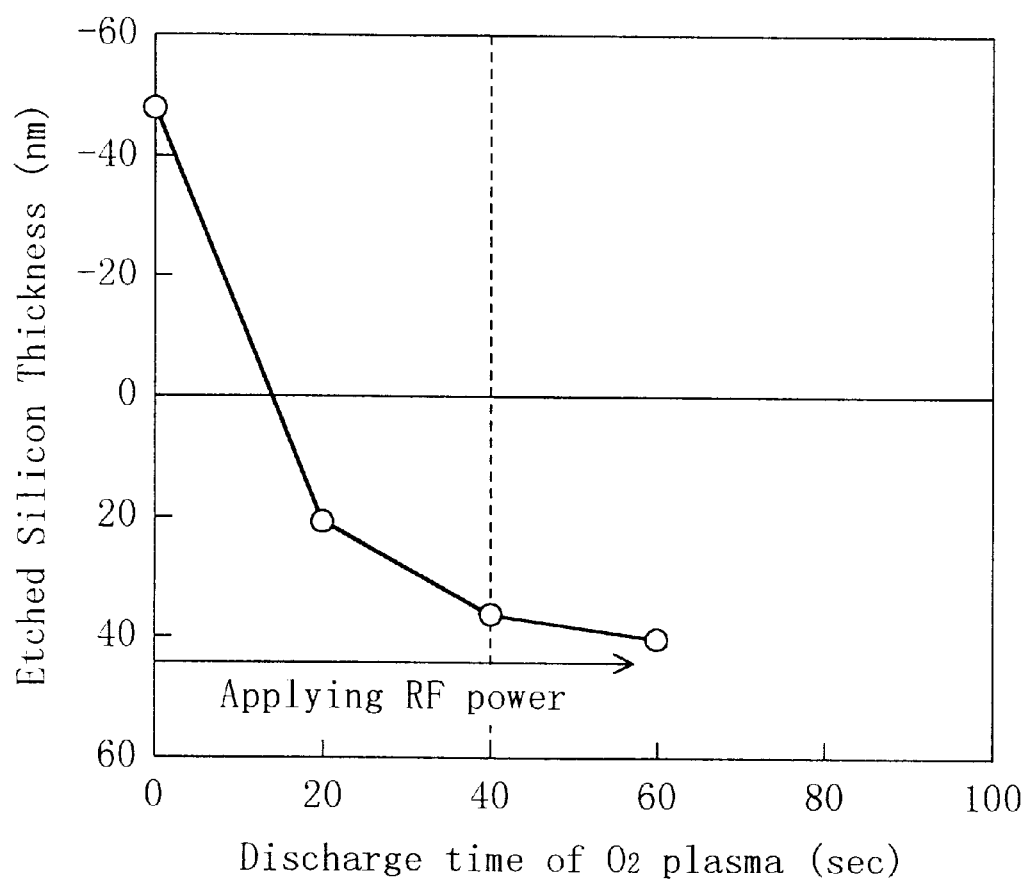
FIG. 2 is a graph illustrating a relationship between a discharge time of oxygen plasma and an etched silicon thickness.

FIG. 2 illustrates a relationship between the thickness of an etched part of the diffusion layer in the silicon substrate 4 (hereinafter, such a thickness will be referred to as an "etched silicon thickness") and a discharge time of oxygen plasma. On the axis of ordinates, negative values represent thicknesses of the polymer film on the bottom of the contact hole, while positive values represent etched silicon thicknesses. As can be easily understood from FIG. 2, for a certain period of time after the oxygen plasma started to discharge, the diffusion layer is etched at a high rate.

The present invention prevents the increase of contact resistance by removing fluorine from oxygen plasma.

Hereinafter, preferred embodiments of the method for fabricating a semiconductor device of the present invention will be described.

EMBODIMENT 1

Figure 3:
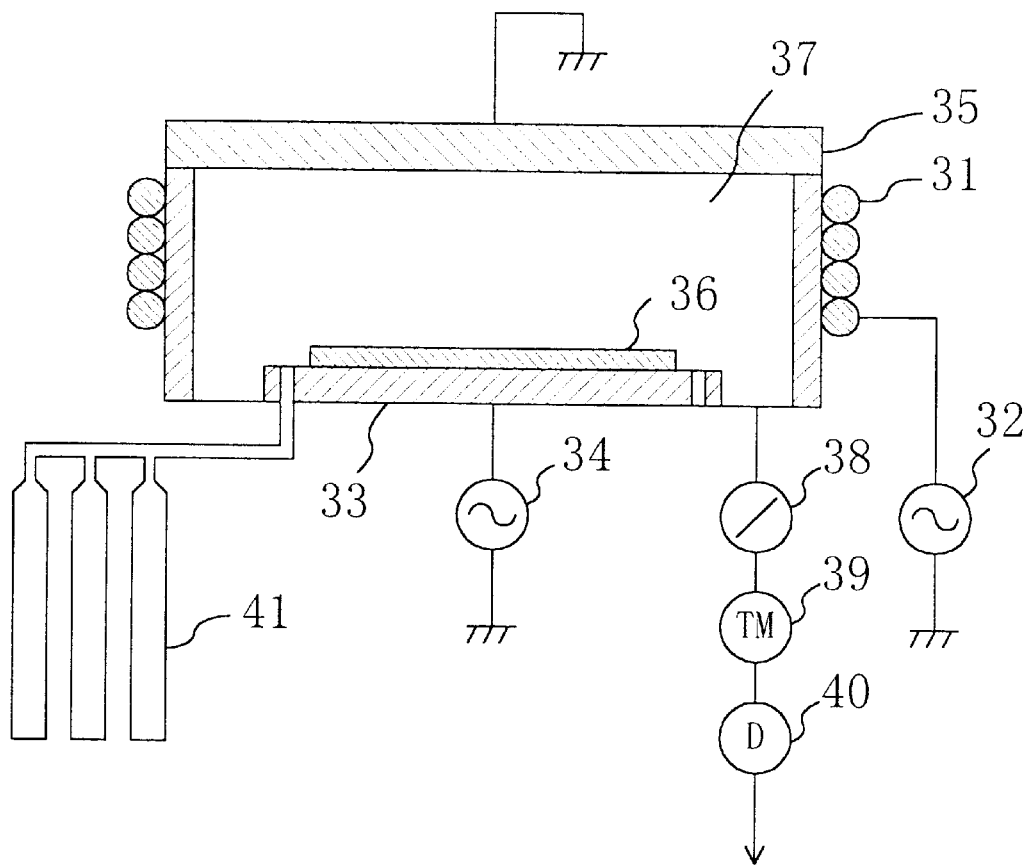
FIG. 3 is a schematic representation of a plasma etching apparatus used in the first and second embodiments of the present invention.

First, a dry etching apparatus used for carrying out the present invention will be described with reference to FIG. 3. The apparatus shown in FIG. 3 is an etching apparatus using inductively coupled plasma. An inductively coupled plasma apparatus is recently the object of much attention as an apparatus that can generate high-density plasma at a relatively low gas pressure.

The apparatus shown in FIG. 3 includes a reaction chamber 37 in which dry etching is performed. The outer sidewall of the reaction chamber 37 is surrounded by induction coils 31 for generating plasma inside the reaction chamber 37. The induction coils 31 are connected to a radio frequency (RF) power supply 32 and are supplied with RF power from the RF power supply 32.

On the bottom of the reaction chamber 37, a lower electrode 33 supporting a substrate to be processed (silicon substrate 36) is provided. The lower electrode 33 is connected to another RF power supply 34 via a matcher (not shown) and is supplied with RF power from the RF power supply 34. In this dry etching apparatus, the power supply 32 for generating plasma and the power supply 34 for applying a voltage to the silicon substrate can be independently controlled.

A quartz ring (not shown) is placed to surround the upper surface of the lower electrode 33. On the ceiling of the reaction chamber 37, an upper electrode 35, made of silicon, for example, is provided and is grounded.

Between an outlet port of the reaction chamber 37 and the outside, a pressure control valve 38, a turbo molecular pump 39 and a dry pump 40 are inserted. The pressure control valve 40 operates to keep the pressure inside the reaction chamber 37 at a predetermined value in the range from 1 mTorr to 100 mTorr, for example.

Gases to be turned into plasma (i.e., an etching gas) are supplied from respective gas cylinders 41 into the reaction chamber 37 via respective mass flow controllers (not shown). When a sufficient amount of etching gas is supplied into the reaction chamber 37, RF power is applied from the RF power supply 32 to the induction coils 31 disposed on the outer sidewall of the reaction chamber 37, thereby generating plasma inside the reaction chamber 37. In this embodiment, by applying RF power in the range from 1000 W to 3000 W to the induction coils 31, high-density plasma can be generated at a density of $10^{11}$ cm$^{-3}$ or more.

After the plasma has been formed and stabilized, RF power is applied from the RF power supply 34 to the lower electrode 33, thereby applying a self-bias voltage to the silicon substrate 36 and bombarding the silicon substrate 36 with positive ions from the plasma. In this manner, reactive plasma etching processing proceeds and a film to be etched, formed on the silicon substrate 36, is etched. It is noted that the power density of the RF power is preferably set at 8 kW/m$^2$ or less.

Next, a method for fabricating a semiconductor device of the first embodiment will be described with reference to FIG. 4 and FIGS. 5A and 5B, in addition to FIG. 3.

Figure 5A:
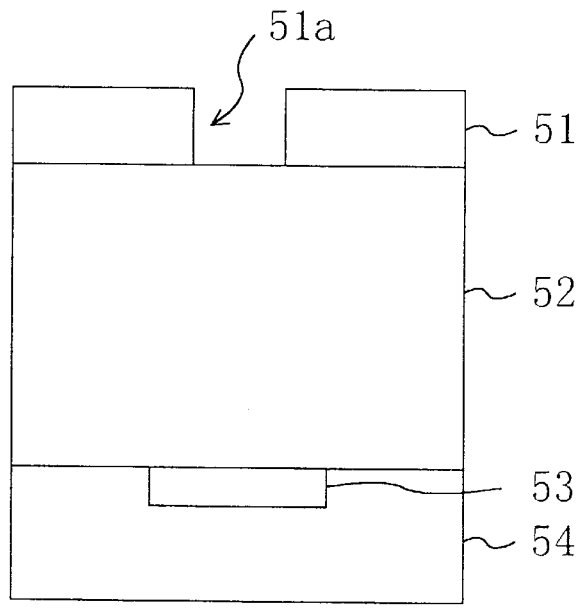
FIGS. 5A and 5B are cross-sectional views illustrating an etching process step for forming a contact hole.

First, as shown in FIG. 5A, a BPSG (borophospho silicate glass) film 52 is deposited by chemical vapor deposition technique on a silicon substrate 54 (or 36 in FIG. 3). Then, a photoresist pattern 51 is formed by a known lithography technique on the BPSG film 52 to have an opening 51a defining the shape and position of a contact hole to be formed. The opening 51a is formed to be located above an impurity diffusion region 53 formed in the surface region of the silicon substrate 54. The surface region of the impurity diffusion region 53 may be a silicide layer.

Next, the silicon substrate 36 is placed on the lower electrode 33 provided in the reaction chamber 37 of the plasma etching apparatus shown in FIG. 3. And then the process step of forming a contact hole by etching (Step S1 in FIG. 4; hereinafter, simply referred to as a "contact etching process step") is performed. This contact etching process step will be described in detail with reference to FIG. 3. First, before etching is started, an etching gas mainly composed of fluorocarbon gas is introduced from the gas cylinders 41 into the reaction chamber 37, and RF power is applied from the RF power supply 32 to the coils 31. In this embodiment, a mixed gas of $C_4F_8/CH_2F_2/Ar/Co/O_2$ is used as the etching gas. By applying the RF power, plasma is generated inside the reaction chamber 37. Thereafter, the RF power supply 34 applies RF power to the lower electrode 33, thereby applying a self-bias voltage to the silicon substrate 36. Since the silicon substrate 36 is negatively charged with respect to the plasma, the silicon substrate 36 is bombarded with positive ions in the plasma.

Figure 5B:
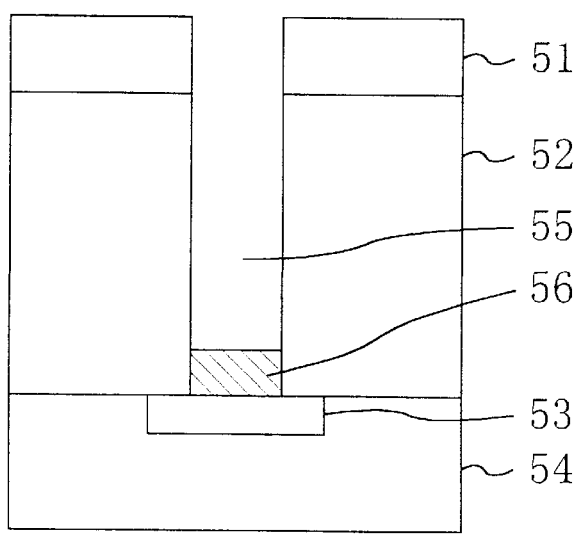

FIGS. 5A and 5B will be referred to again. Part of the BPSG film 52, which is not covered with the photoresist pattern 51 (i.e., an exposed part inside the opening 51a), is etched over the silicon substrate 54. As a result, a contact hole 55 is formed in the BPSG film 52 as shown in FIG. 5B. The contact hole 55 reaches the impurity diffusion region 53 in the silicon substrate 54. Immediately after the contact hole 55 has been formed, a polymer film 6 mainly composed of carbon and fluorine is formed on the bottom of the contact hole 55. The thickness of the polymer film 56 might be about 10 to about 200 nm.

Figure 4:
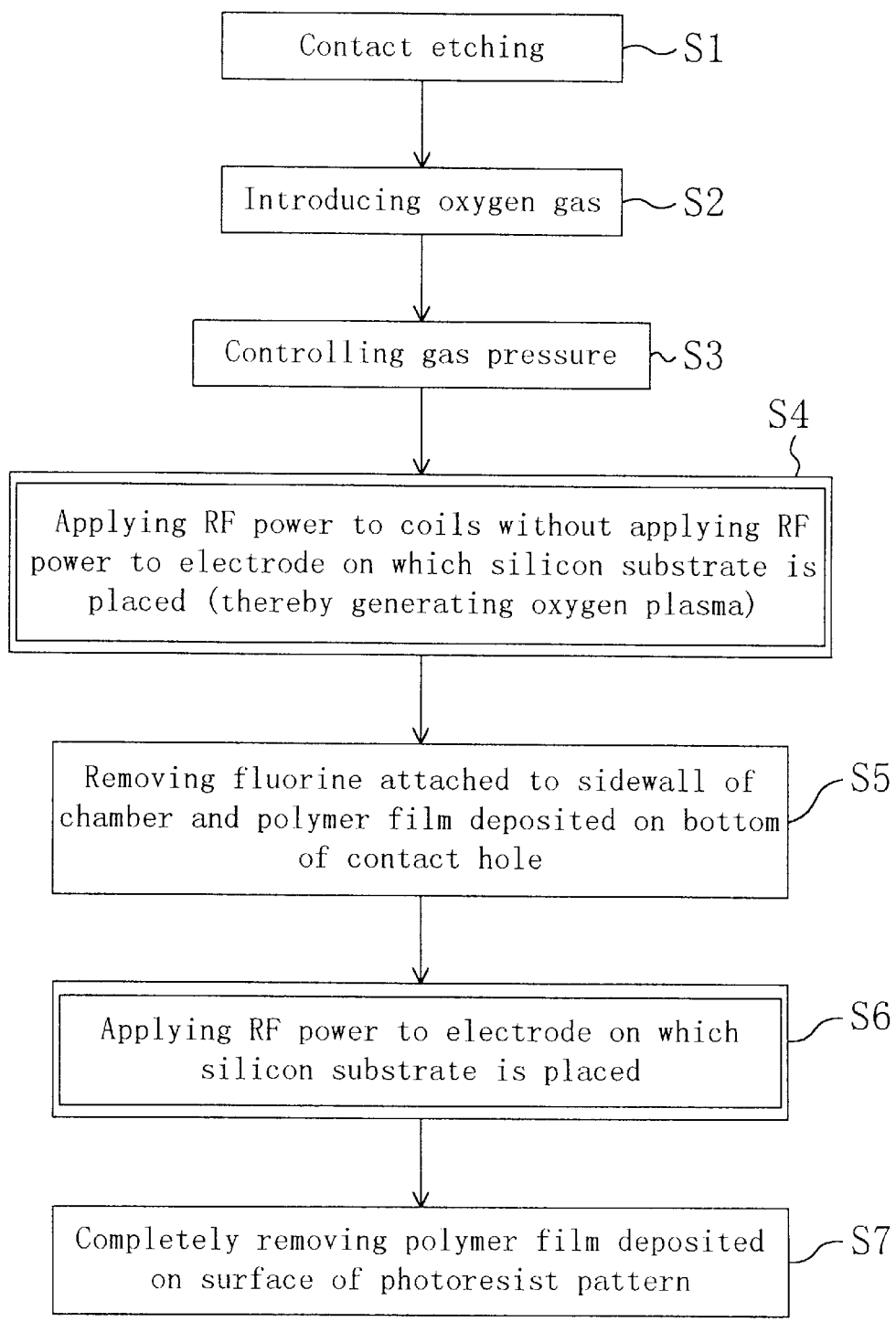
FIG. 4 is a flow chart illustrating process steps for fabricating a semiconductor device in the first embodiment of the present invention.

Next, Step S2 shown in FIG. 4 is performed. Specifically, oxygen gas is introduced from the gas cylinders 41 into the reaction chamber 37. And in Step S3 shown in FIG. 4, the pressure of the oxygen gas inside the reaction chamber 37 is controlled by adjusting the opening of the pressure control valve 38.

Then, in Step S4, RF power is applied by the RF power supply 32 to the coils 31 with no RF power applied by the RF power supply 34 to the lower electrode 33 on which the silicon substrate 36 is placed. As a result, oxygen plasma is generated inside the reaction chamber 37.

By using this oxygen plasma, the polymer film deposited on the bottom of the contact hole and fluorine attached to the inner sidewall of the reaction chamber are removed (Step S5). In this embodiment, this process step of removing fluorine is performed for 40 seconds.

In Step S6, RF power is applied by the RF power supply 34 to the lower electrode 33 on which the silicon substrate 36 is placed, thereby applying a self-bias voltage to the silicon substrate 36. As a result, the silicon substrate 36 attracts oxygen ions from the oxygen plasma toward itself. In this manner, the polymer film deposited on the surface of the photoresist pattern is completely removed (Step S7).

In this embodiment, no bias voltage is applied to the silicon substrate until 40 seconds have passed immediately after the oxygen plasma was generated. And after 40 seconds have passed, a bias voltage is applied to the silicon substrate. The reasons why the voltage is applied discontinuously will be described in detail below.

Figure 6:
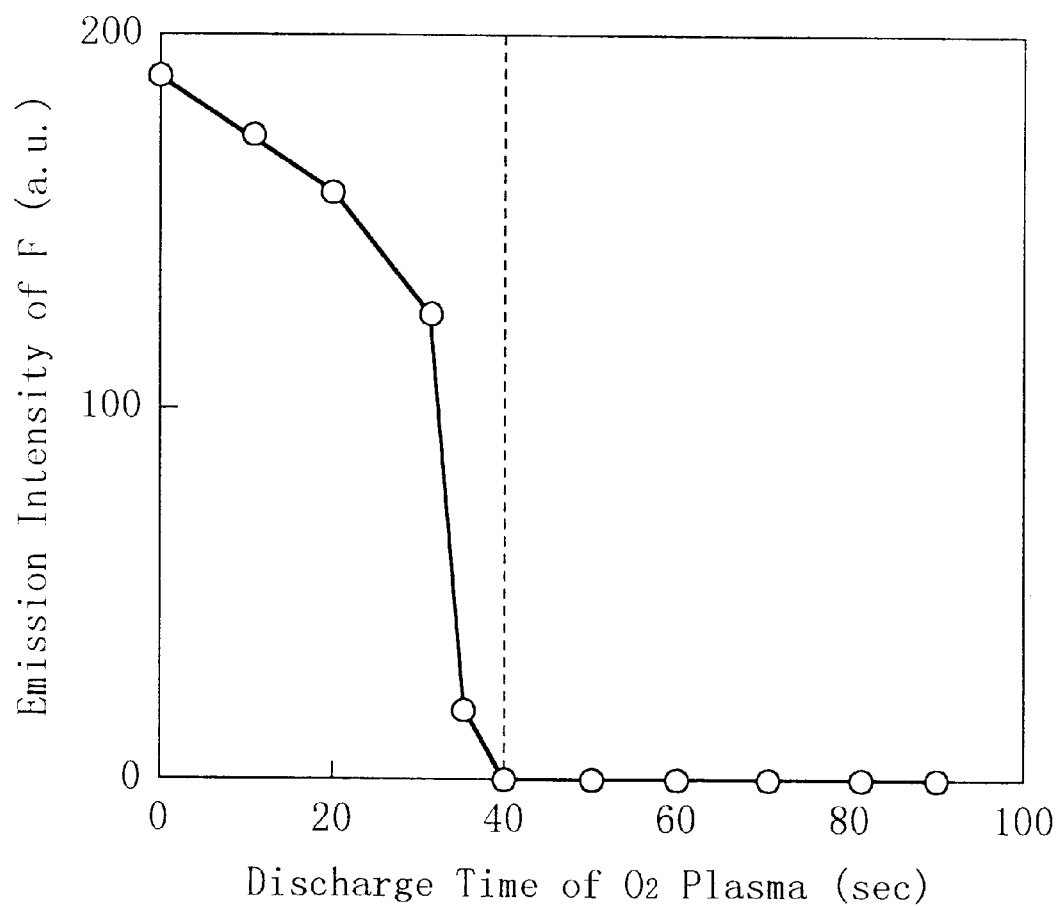
FIG. 6 is a graph illustrating a relationship between a discharge time of oxygen plasma and an optical emission intensity of fluorine.

FIG. 6 illustrates a relationship between a discharge time of oxygen plasma formed for removing fluorine and an optical emission intensity of fluorine (optical emission wavelength: 685.6 nm) contained in the oxygen plasma. As can be understood from FIG. 6, the optical emission intensity of fluorine attenuates as the time passes since the discharge started. And at a time 40 seconds have passed since the discharge started, the optical emission intensity reaches zero (i.e., less than a measurable limit). That is to say, it can be understood that fluorine is substantially removed from the oxygen plasma at a time 40 seconds have passed since the discharge started.

Figure 7:
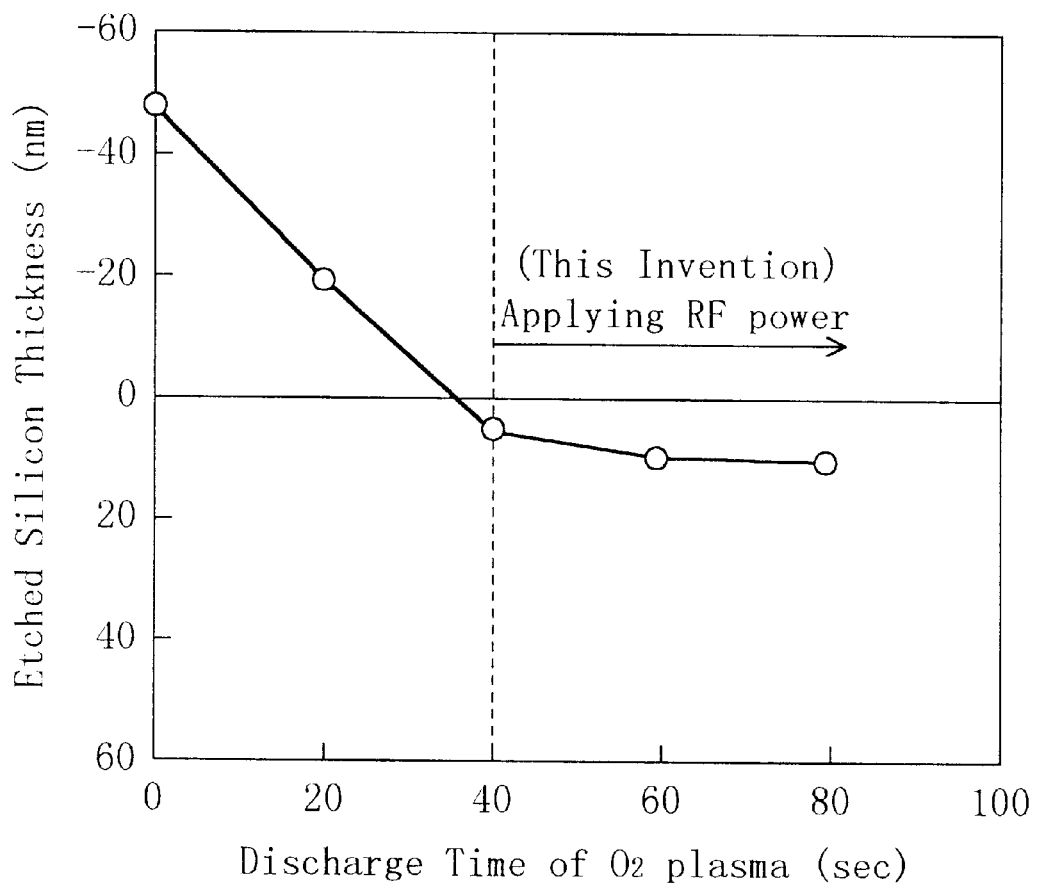
FIG. 7 is a graph illustrating a relationship between a discharge time of oxygen plasma and an etched silicon thickness.

FIG. 7 illustrates a relationship between an etched silicon thickness of the diffusion layer 53 and a discharge time of oxygen plasma. On the axis of ordinates in FIG. 7, negative values represent thicknesses of the polymer film on the bottom of the contact hole, while positive values represent etched silicon thicknesses. As can be understood from FIG. 7, the polymer film is removed substantially completely at a time 40 seconds have passed since the discharge of the oxygen plasma started.

Accordingly, it can be understood that at a time 40 seconds have passed since the oxygen plasma was generated, the polymer film and fluorine in the reaction chamber are removed substantially simultaneously. Therefore, on and after this point in time, if a bias voltage is applied to the silicon substrate, the diffusion layer 53 is hardly etched by fluorine and fluorine ions. In this embodiment, after 40 seconds have passed since the discharge of the oxygen plasma started, a bias is applied to the substrate. As can be understood from FIG. 7, even at a time 80 seconds have passed since the discharge started, the etched silicon thickness is as small as about 10 nm.

Figure 8:
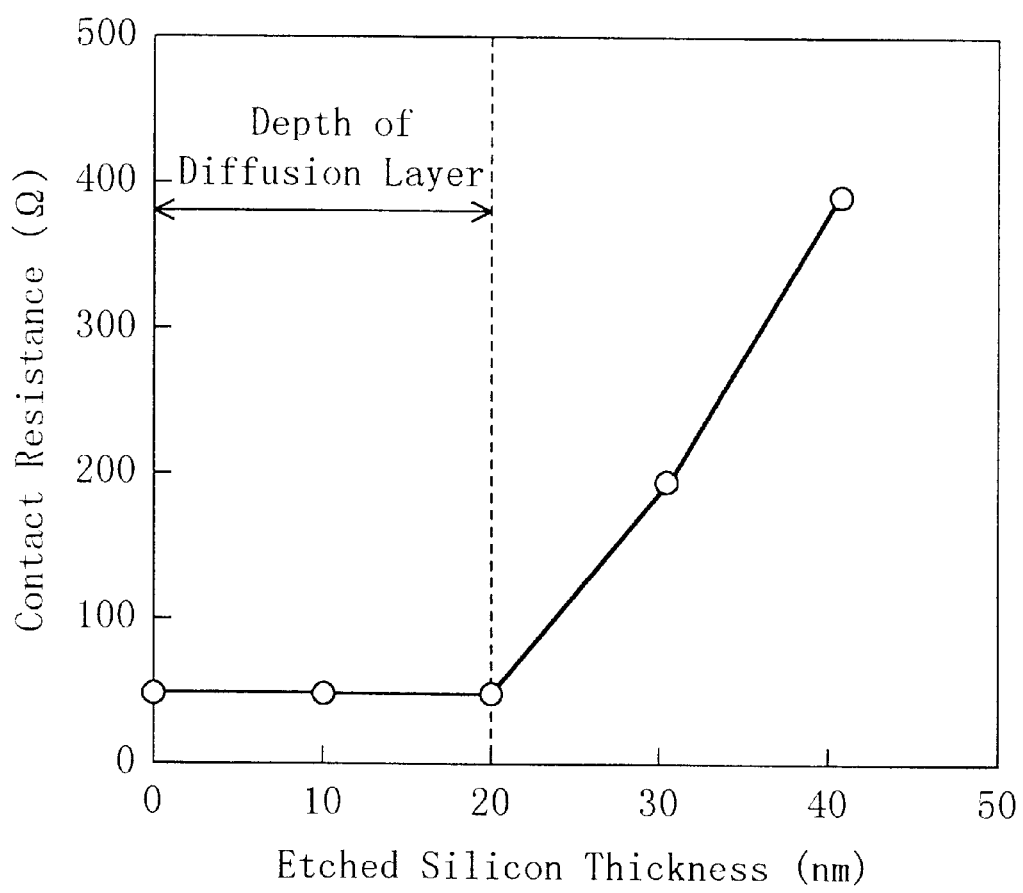
FIG. 8 is a graph illustrating a relationship between an etched silicon thickness and contact resistance.

FIG. 8 illustrates a relationship between contact resistance and an etched silicon thickness. If the etched silicon thickness is as small as about 10 nm as in this embodiment, the increase of contact resistance is not observed. By contrast, if the step of removing the polymer film is performed for the required length (about 40 seconds) with a bias voltage applied to the substrate from the instant the discharge of oxygen plasma started, the diffusion layer is etched by as much as about 40 nm (see FIG. 2). Thus, as can be understood from FIG. 8, the contact resistance considerably increases in such a case.

It can be understood that by suspending the application of bias power to the electrode on the substrate in this manner until fluorine has been removed from the oxygen plasma, the etched thickness of the diffusion layer can be reduced. Hereinafter, the reasons will be described in detail with reference to FIGS. 9A through 9D.

Figure 9A:
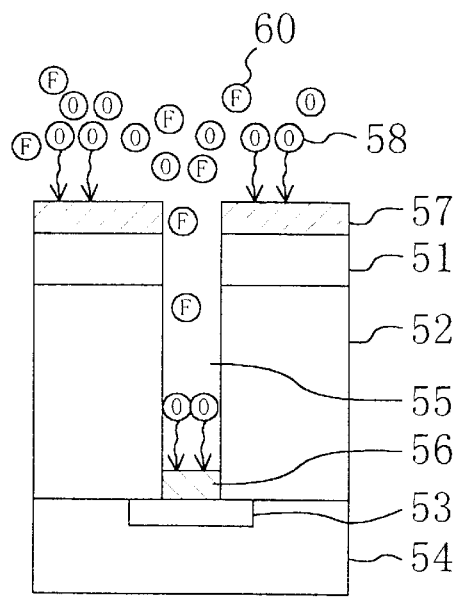
FIGS. 9A through 9D are diagrams illustrating a principle on which a diffusion layer is not etched so much in the first embodiment of the present invention.

FIG. 9A illustrates the cross section of the silicon substrate 54 on which the contact hole 55 has been formed in the silicon dioxide film 52 by dry etching. The photoresist pattern 51 has been defined on the silicon dioxide film 52. And the polymer films 56 and 57 have been deposited on the bottom of the contact hole 55 and on the resist pattern 51, respectively. In order to dissolve the polymer film functioning as a source of supplying fluorine onto the inner wall of the reaction chamber and thereby remove fluorine from the reaction chamber, oxygen plasma is generated inside the reaction chamber. As described above, no bias voltage is applied to the silicon substrate 54 for a certain period of time after the oxygen plasma was generated.

As shown in FIG. 9A, not only oxygen 58 but also fluorine 60 exist in the oxygen plasma. Since no bias voltage is applied to the silicon substrate 54, oxygen 58 etches the polymer film 57 on the surface of the substrate and the polymer film 56 on the bottom of the contact hole 55 (in the period of 0 to 35 seconds after the discharge started).

Figure 9B:
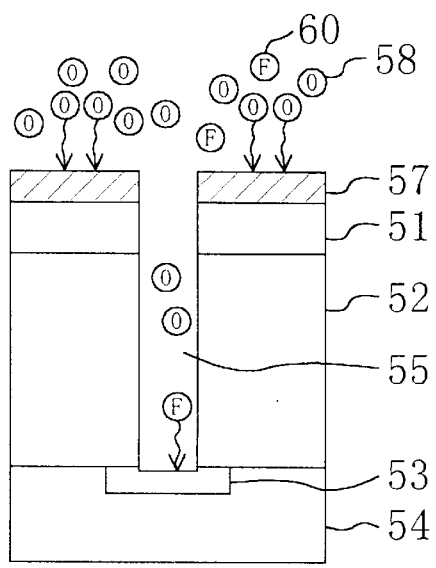
Figure 9C:
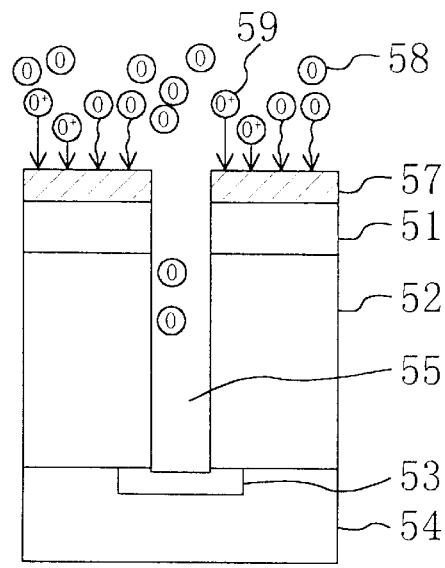

Next, as shown in FIG. 9B, when the polymer film 56 on the bottom of the contact hole 55 is completely removed by oxygen 58 in the oxygen plasma, a very small amount of residual fluorine 60 starts to etch the diffusion layer 53 (in the period of 35 to 40 seconds after the discharge started).

Even after the polymer film 56 on the bottom of the contact hole 55 has been completely removed, the polymer film 57 deposited on the resist pattern 51 has not been removed completely yet. In order to remove this polymer film 57 quickly, a bias voltage is applied to the silicon substrate 54. If the bias voltage were not applied, it would take a very long time to remove the polymer film 57. By applying the bias voltage to the silicon substrate 54, the polymer film 57 is quickly removed by oxygen 58 and oxygen ions 59. At this point in time, fluorine 60 has already been exhausted from the oxygen plasma. Accordingly, the diffusion layer 53 is not etched by fluorine 60 and fluorine ions.

Figure 9D:
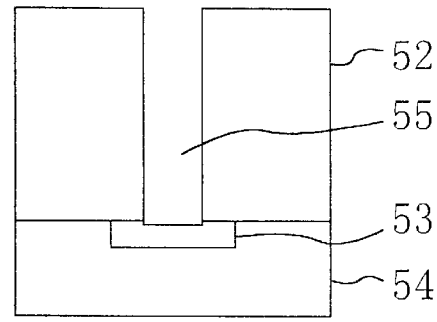

In this embodiment, at a time 80 seconds have passed since the discharge of the oxygen plasma started, the polymer film 57 and the resist pattern 51 are completely removed as shown in FIG. 9D. However, the diffusion layer 53 has been etched by as small as about 10 nm.

As described above, in this embodiment, while fluorine exists in the oxygen plasma, no bias voltage is applied to the silicon substrate 54 (the process step of removing fluorine). And after fluorine has been exhausted, a bias voltage is applied to the silicon substrate 54. In this manner, it is possible to prevent fluorine and fluorine ions from etching the diffusion layer 53 and the contact resistance from being increased. In addition, the polymer film 57 on the resist pattern 51 and the resist pattern 51 itself can also be removed in a short period of time.

EMBODIMENT 2

Next, the second embodiment of the present invention will be described. The dry etching process of this embodiment is also performed using the apparatus shown in FIG. 3.

Figure 10:
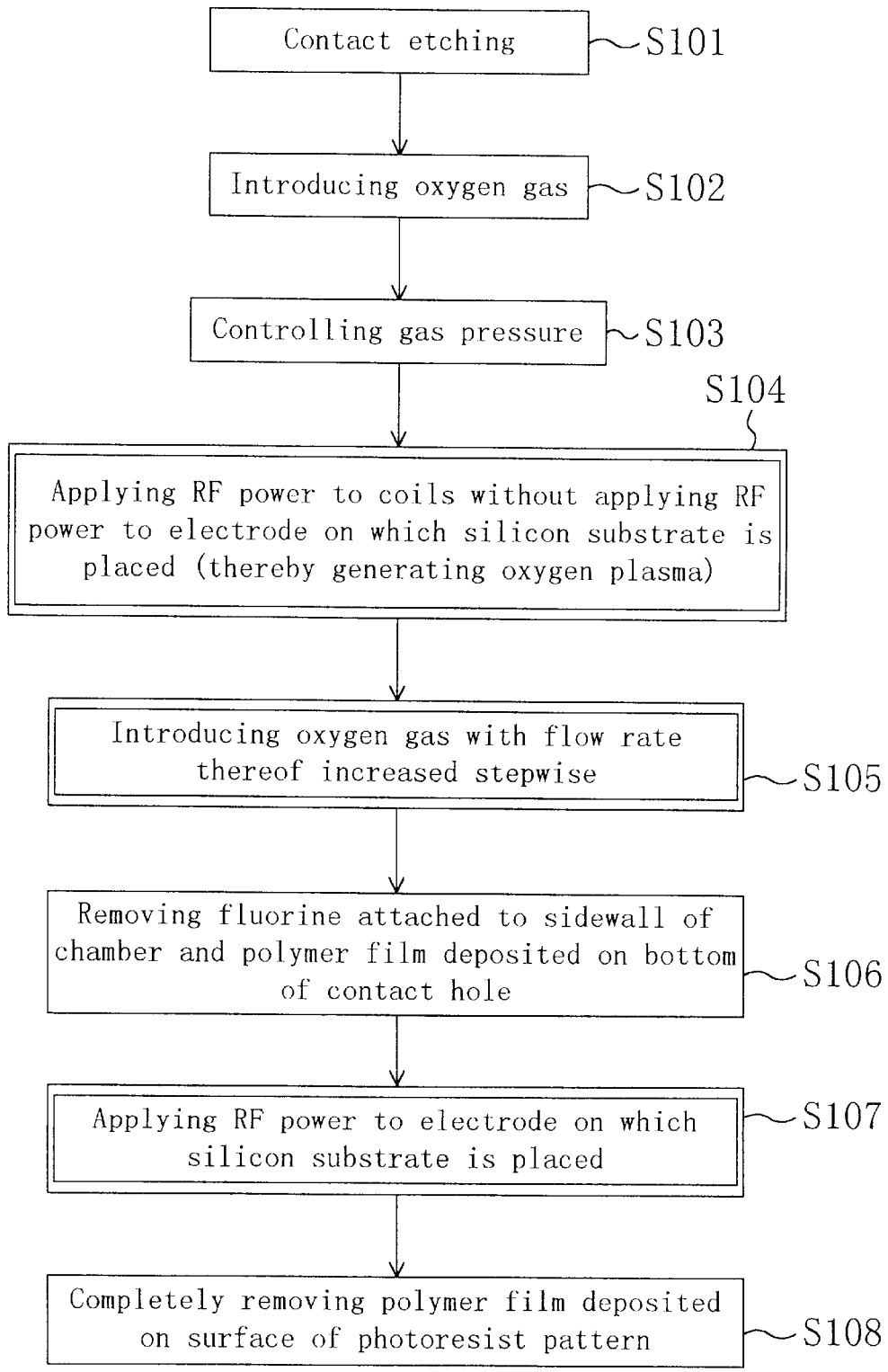
FIG. 10 is a flow chart illustrating process steps for fabricating a semiconductor device in the second embodiment of the present invention.

First, with reference to FIG. 10, it will be described how the process is performed in this embodiment.

In Step S101, a contact hole is formed by etching.

In Step S102, oxygen gas is introduced into the reaction chamber 37.

In Step S103, the pressure of the oxygen gas is controlled by adjusting the opening of the pressure control valve 38.

In Step S104, while no RF power is applied to the lower electrode 33 on which the silicon substrate 36 is placed, RF power is applied by the RF power supply 32 to the coils 31, thereby generating oxygen plasma.

In Step S105, the flow rate of the oxygen gas is increased stepwise.

In Step S106, fluorine attached to the inner sidewall of the reaction chamber 37 and the polymer film deposited on the bottom of the contact hole are removed.

In Step S107, RF power is applied to the lower electrode 33 supporting the silicon substrate 36, thereby applying a bias voltage to the silicon substrate 36. As a result, the silicon substrate 36 is bombarded with oxygen ions in the oxygen plasma.

In Step S108, the polymer film deposited on the surface of the photoresist is completely removed.

Next, a method for generating oxygen plasma in this embodiment will be described in detail.

Figure 11:
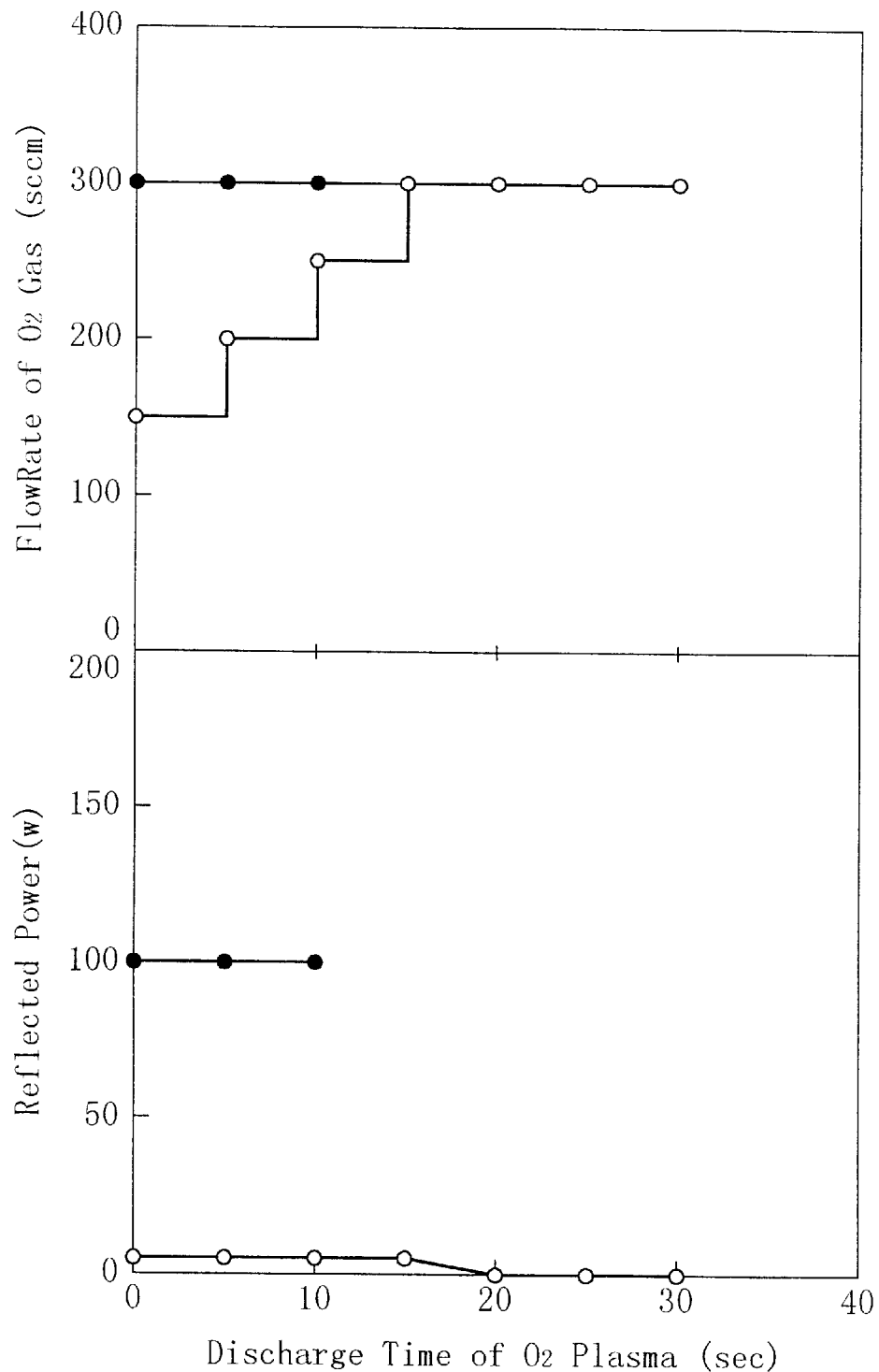
FIG. 11 is a graph illustrating a relationship between a discharge time of oxygen plasma and a flow rate of oxygen gas and a relationship between a discharge time of oxygen plasma and reflected power.

FIG. 11 illustrates the variations of the flow rate of oxygen gas and the reflected power with the discharge time of the oxygen plasma. The reflected power is obtained by applying RF power of 2500 W to the induction coils 31 of the apparatus shown in FIG. 3. In FIG. 11, the data obtained by keeping the flow rate of the oxygen gas at a constant value of 300 sccm from the beginning is indicated by solid circles, while the data obtained by increasing the flow rate of the oxygen gas stepwise from 150 sccm is indicated by open circles.

If RF power is applied while the oxygen gas is introduced into the reaction chamber at the flow rate of 300 sccm, then the reflected power becomes 100 W, which cannot be matched. Accordingly, the oxygen plasma cannot be maintained and the discharge ends 10 seconds after it started. By contrast, in this embodiment, RF power is applied while the oxygen gas is introduced initially at a flow rate as low as 150 sccm. Then, the flow rate of the oxygen gas is gradually increased to finally reach a flow rate as high as 300 sccm. In such a case, matching is realized and the reflected power can be as small as 5 W or less. As a result, oxygen plasma can be stably generated and maintained.

Figure 12:
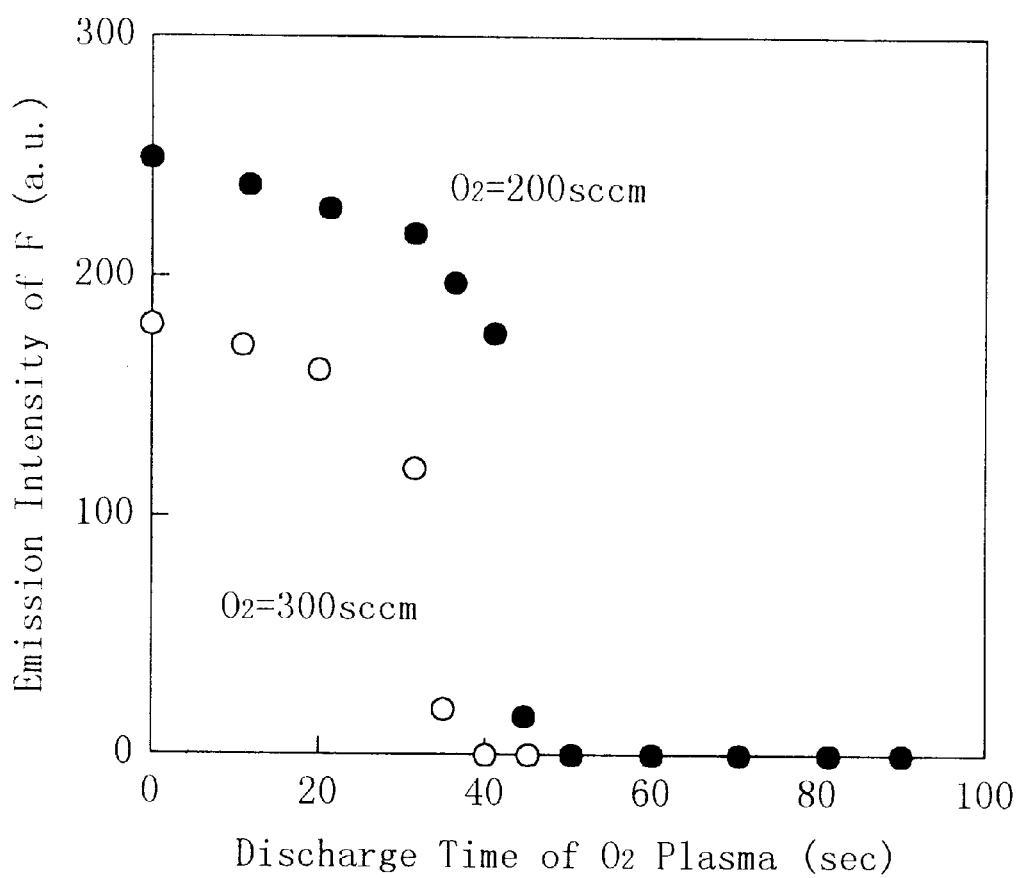
FIG. 12 is a graph illustrating a relationship between a discharge time of oxygen plasma and an optical emission intensity of fluorine.

FIG. 12 illustrates the variation of the intensities of an optical emission of fluorine with the discharge time of oxygen plasma. The data shown in FIG. 12 was obtained by providing an emission spectral analyzer for the dry etching apparatus shown in FIG. 3 and thereby measuring the intensities of an optical emission of fluorine (at a wavelength of 685.6 nm) in the oxygen plasma. As can be understood from FIG. 12, if the flow rate of the oxygen gas is 200 sccm, it takes 50 seconds after the discharge started to reduce fluorine. On the other hand, if the flow rate of the oxygen gas is 300 sccm, the optical emission intensity of fluorine has sufficiently attenuated at point in time 40 seconds have passed since the discharge started. In other words, if the flow rate of the oxygen gas is 300 sccm, fluorine in the oxygen plasma has been removed at point in time 40 seconds have passed since the discharge started. Accordingly, it can be understood that in discharging electricity, the larger the flow rate of the oxygen gas supplied to the reaction chamber is, the sooner fluorine can be removed from the inner sidewall of the reaction chamber.

Figure 13:
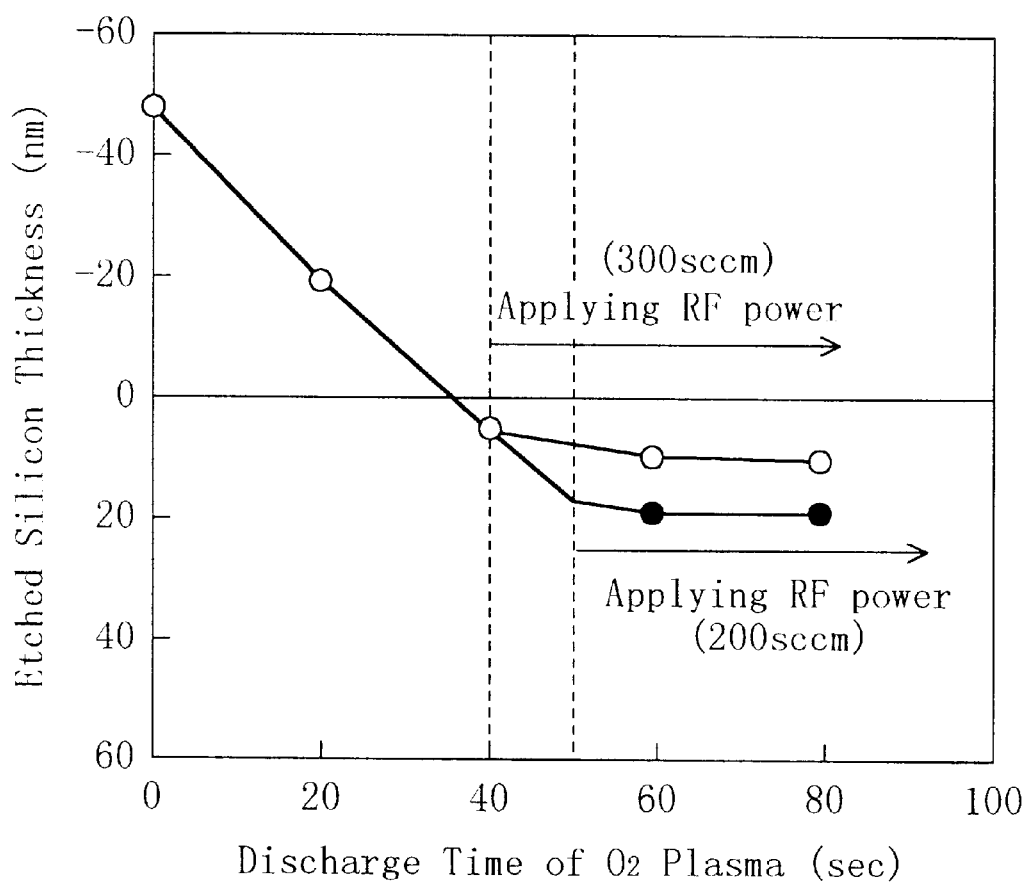
FIG. 13 is a graph illustrating a relationship between a discharge time of oxygen plasma and an etched silicon thickness.

FIG. 13 illustrates the variation of an etched silicon thickness with the discharge time of the oxygen plasma. On the axis of ordinates in FIG. 13, negative values represent the thicknesses of the polymer film, while positive values represent etched silicon thicknesses.

If the flow rate of the oxygen gas is 200 sccm, no bias power is applied during the period of 35 to 50 seconds after the discharge started. This is because fluorine disappears from the inner sidewall of the reaction chamber at a time 50 seconds have passed since the discharge started. However, even in such a case, the diffusion layer is etched by fluorine by as much as 18 nm. And after 50 seconds have passed since the discharge started, bias power is applied, thereby removing the polymer film on the surface of the substrate.

On the other hand, if the flow rate of the oxygen gas is 300 sccm, no bias power is applied during the period of 35 to 40 seconds after the discharge started. This is because fluorine disappears from the inner sidewall of the reaction chamber at a time 40 seconds have passed since the discharge started. In this case, the diffusion layer is etched by fluorine by only 5 nm. And after 40 seconds have passed since the discharge started, bias power is applied, thereby removing the polymer film on the surface of the substrate.

Accordingly, the larger the flow rate of oxygen gas is, the sooner fluorine can be removed from the inner sidewall of the reaction chamber. Thus, the time of the post-processing, performed using oxygen plasma after the contact hole has been formed by etching, can be shortened. As a result, it is possible to reduce the thickness of an etched part of the diffusion layer and the increase of contact resistance.

In this embodiment, by increasing the flow rate of the oxygen gas stepwise, the reflected wave of the RF power applied to the coils 31 can be reduced and plasma can be stably generated and maintained when the flow rate of the oxygen gas reaches a high value. Also, by supplying the oxygen gas at a high flow rate, fluorine can be removed from the sidewall of the reaction chamber 37 with a lot of oxygen in a shorter period of time. Accordingly, the time of the oxygen plasma processing, performed after the contact hole has been formed by etching, can be shortened. As a result, it is possible to reduce the thickness of an etched part of the diffusion layer and the contact resistance.

EMBODIMENT 3

Hereinafter, a dry etching apparatus used in the third embodiment will be described with reference to FIG. 14.

Figure 14:
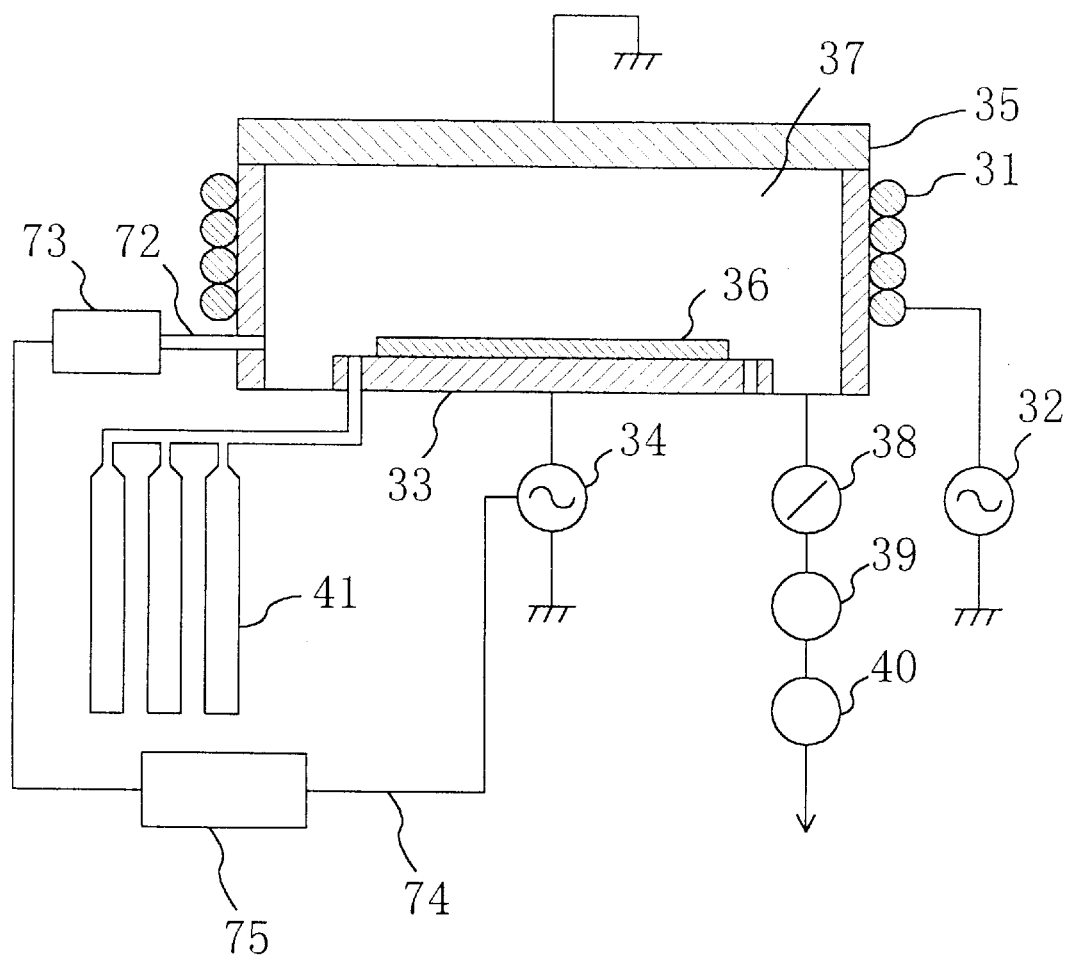
FIG. 14 is a schematic representation of an etching apparatus used in the third embodiment of the present invention.

The apparatus shown in FIG. 14 has fundamentally the same structure as that of the dry etching apparatus shown in FIG. 3. The former apparatus is different from the latter apparatus in that the former apparatus further includes: an optical fiber 72; an emission spectral analyzer 73; a signal line 74; and a central processing unit (CPU) 75.

The optical fiber 72 has the function of taking out the light radiated by the plasma in the reaction chamber 37. The emission spectral analyzer 73 receives the light radiated by the plasma through the optical fiber 72 and measures the optical emission intensity of a spectrum within a predetermined wavelength range. The CPU 75 performs various logical operations in response to the output of the emission spectral analyzer 73. And when the optical emission intensity within the predetermined wavelength range varies to enter a prescribed range, the CPU 75 outputs a required signal to the RF power supply 34 through the signal line 74.

In this embodiment, after the apparatus shown in FIG. 14 has performed a contact etching process step, first, oxygen gas is introduced from the gas cylinders 41 into the reaction chamber 37 and RF power is applied by the RF power supply 32 to the coils 31, thereby generating plasma. Next, the light collected by the optical fiber 72 is subjected to spectroscopy in the emission spectral analyzer 73, thereby measuring the optical emission intensity of fluorine. The CPU 75 identifies a time the optical emission intensity of fluorine reaches a point lower than the measurable limit. And at the point in time, the CPU 75 transmits a signal to the RF power supply 34 through the signal line 74, thereby activating the RF power supply 34. Then, the RF power supply 34 starts to operate and applies RF power to the lower electrode 33. As a result, the etching species in plasma are attracted to the silicon substrate 36 and the polymer film on the silicon substrate 36 is etched. The CPU 75 is programmed in such a manner as to keep the RF power supply 34 turned OFF while the optical emission of fluorine is being sensed.

Figure 15:
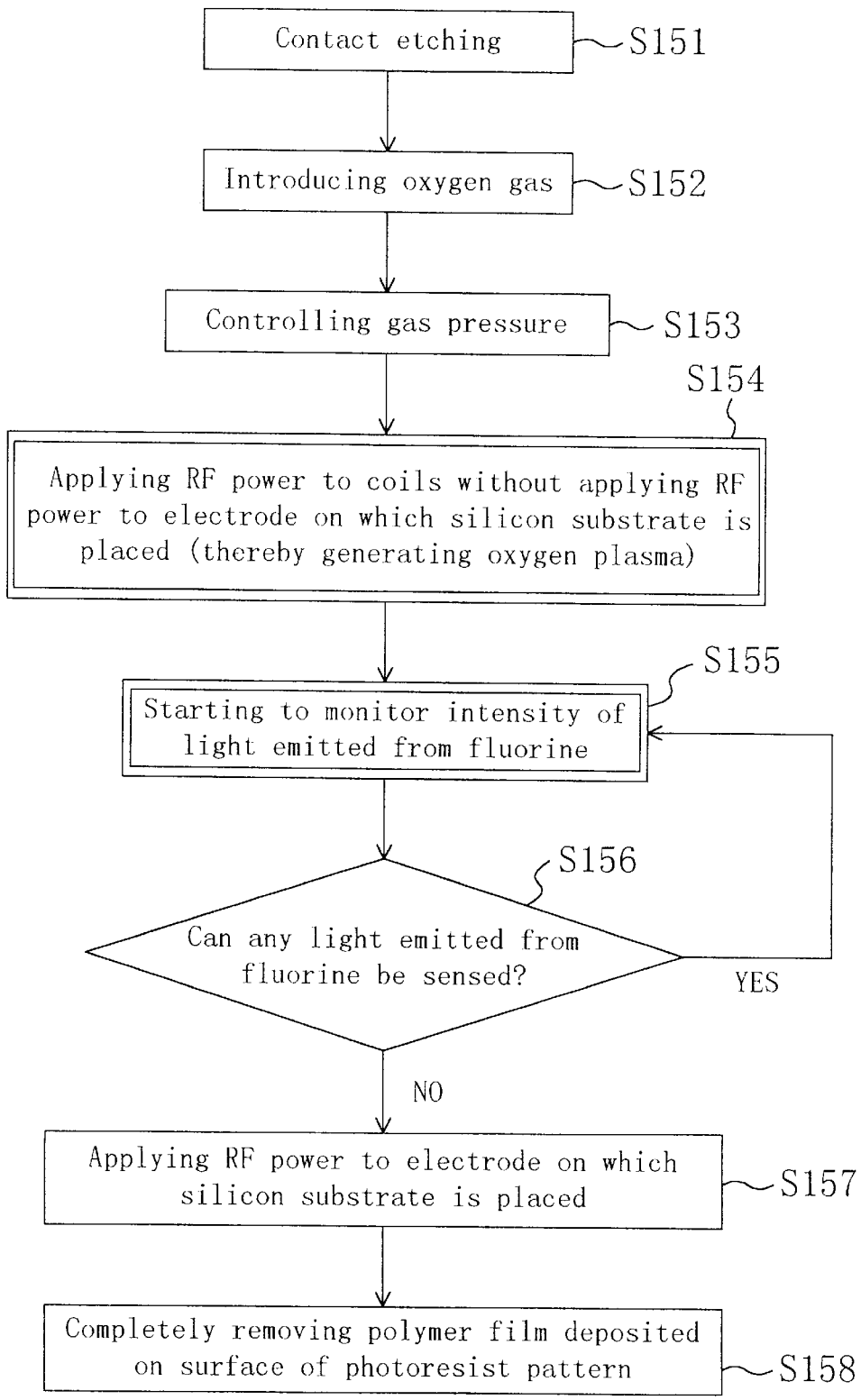
FIG. 15 is a flow chart illustrating process steps for fabricating a semiconductor device in the third embodiment of the present invention.

Next, with reference to FIG. 15, it will be described how the process is performed in this embodiment.

In Step S151, a contact hole is formed by etching.

In Step S152, oxygen gas is introduced into the reaction chamber 37.

In Step S153, the pressure of the oxygen gas is controlled by adjusting the opening of the pressure control valve 38.

In Step S154, while no RF power is applied to the lower electrode 33 on which the silicon substrate 36 is placed, RF power is applied by the RF power supply 32 to the coils 31, thereby generating oxygen plasma.

In Step. S155, while fluorine attached to the inner sidewall of the reaction chamber 37 and the polymer film deposited on the bottom of the contact hole are removed, the optical emission intensity of fluorine (at a wavelength of 685.6 nm, for example) in the oxygen plasma is monitored by the emission spectral analyzer 73.

If the optical emission intensity of fluorine can no longer be sensed in Step S156, then RF power is applied in Step S157 to the lower electrode 33 supporting the silicon substrate 36, thereby applying a bias voltage to the silicon substrate 36. As a result, the silicon substrate 36 is bombarded with oxygen ions in the oxygen plasma.

In Step S158, the polymer film deposited on the surface of the photoresist is completely removed.

Figure 16:
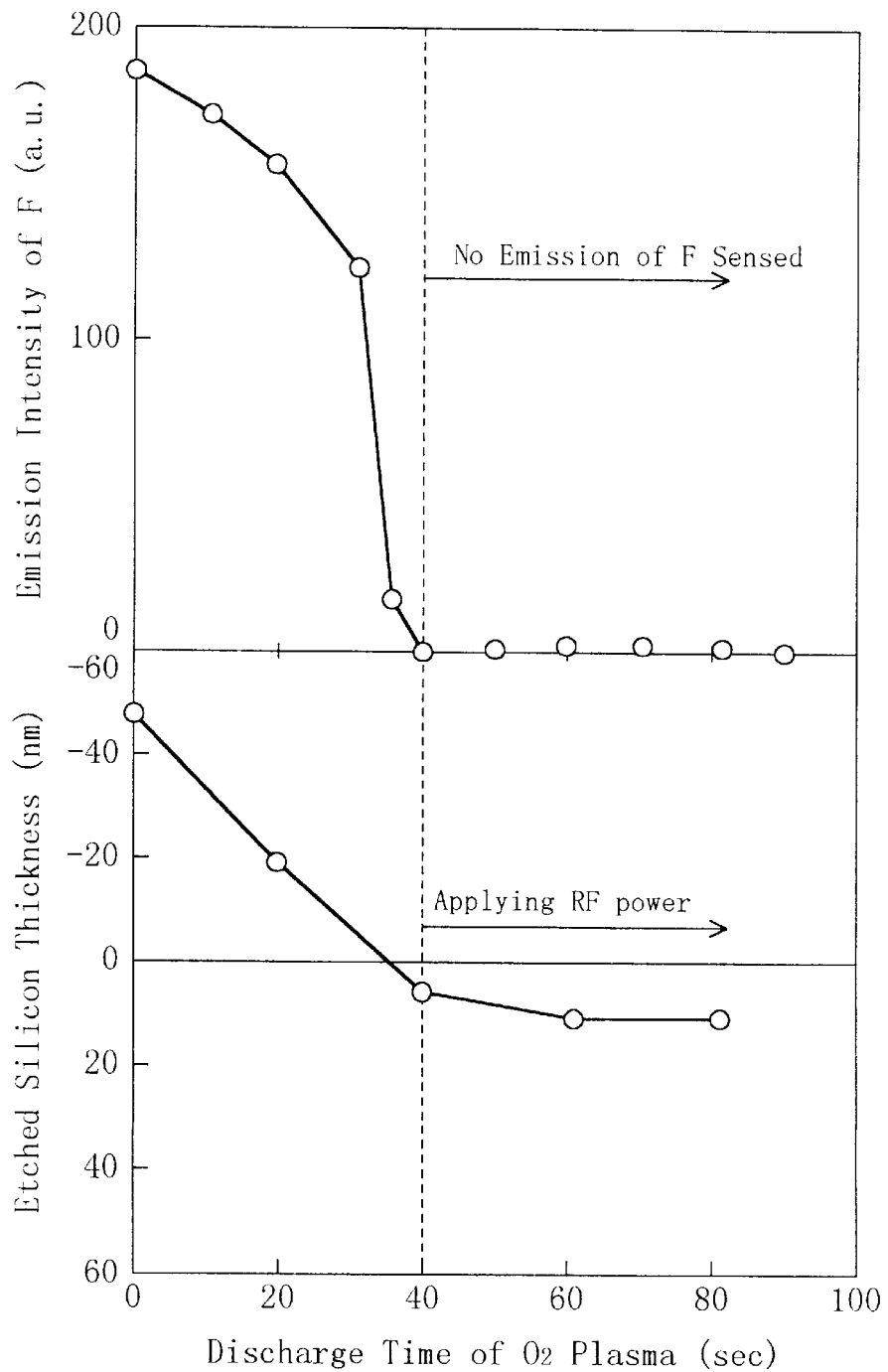
FIG. 16 is a graph illustrating a relationship between a discharge time of oxygen plasma and an optical emission intensity of fluorine and a relationship between a discharge time of oxygen plasma and an etched silicon thickness.

FIG. 16 illustrates a relationship between a discharge time of oxygen plasma and an optical emission intensity of fluorine (at a wavelength of 685.6 nm) and a relationship between the discharge time of oxygen plasma and an etched silicon thickness. In the lower part of FIG. 16, negative values on the axis of ordinates represent the thicknesses of the polymer film, while positive values represent etched silicon thicknesses.

In this embodiment, after it is confirmed that the optical emission intensity of fluorine has sufficiently attenuated, a bias voltage is applied to the silicon substrate. As can be understood from FIG. 16, the diffusion layer is hardly etched in such a case. Also, in this embodiment, the bias power supply is turned ON/OFF in response to a signal representing the optical emission intensity of fluorine. Accordingly, even if the time taken to remove fluorine has changed, the oxygen plasma processing on the substrate can be started at an optimum time.

Accordingly, in this embodiment, the application of a bias voltage to the substrate can be started at an appropriate time based on the optical emission intensity of fluorine. As a result, fluorine can be removed with more efficiency and more certainty.

In this embodiment, the optical emission spectrum of fluorine is the object of measurement. Alternatively, the optical emission spectrum of carbon or carbon oxide may also be measured. During contact etching, a polymer film as a compound of $C_x$ and $C_xF_y$ is deposited on the sidewall of the reaction chamber. The polymer film is dissolved by oxygen plasma as represented by any of the following Formulae (1) to (4) and then exhausted.

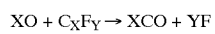
(1)

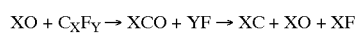
(2)

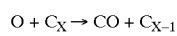
(3)

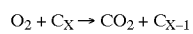
(4)

where X and Y are natural numbers.

If the optical emission spectrum of fluorine, carbon, oxygen, carbon oxide and/or carbon dioxide is measured, it can be determined whether or not the polymer film deposited on the inner sidewall of the reaction chamber has been removed. If the polymer film deposited on the inner sidewall of the reaction chamber has been removed and if the amounts of carbon, oxygen, carbon oxide, carbon dioxide and the like as components of the polymer film have decreased in the reaction chamber to the respective measurable limits or less, then it can be determined that fluorine has also been removed from the reaction chamber.

In this embodiment, the optical emission intensity of fluorine is measured at the wavelength of 685.6 nm, because the light at this wavelength is the intensest of the entire optical emission spectrum of fluorine. Alternatively, the optical emission intensity of fluorine may be measured at any other arbitrary wavelength.

EMBODIMENT 4

Hereinafter, a dry etching apparatus used in the fourth embodiment will be described with reference to FIG. 17.

Figure 17:
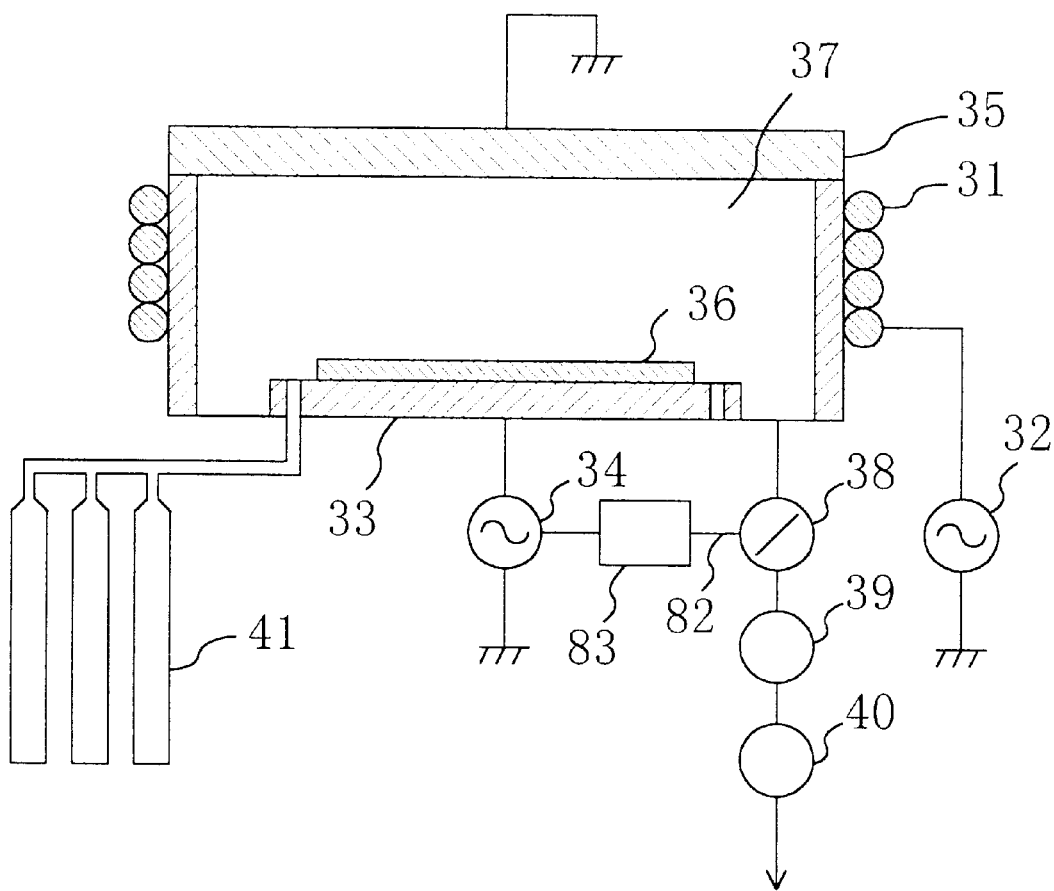
FIG. 17 is a schematic representation of an etching apparatus used in the fourth embodiment of the present invention.

The apparatus shown in FIG. 17 has fundamentally the same structure as that of the dry etching apparatus shown in FIG. 3. The former apparatus is different from the latter apparatus in that the former apparatus further includes a signal line 82 and a CPU 83.

In this embodiment, after the apparatus shown in FIG. 17 has performed a contact etching process step, first, oxygen gas is introduced from the gas cylinders 41 into the reaction chamber 37 and RF power is applied by the RF power supply 32 to the coils 31, thereby generating plasma. Next, the opening of the pressure control valve 38 is measured. The CPU 83 identifies a point in time the opening of the pressure control valve 38 has reached a constant value. And at the point in time, the CPU 83 transmits a signal to the RF power supply 34, thereby activating the RF power supply 34. In response thereto, the RF power supply 34 starts to operate and applies RF power to the lower electrode 33. As a result, the etching species (positive ions) in plasma are attracted to the silicon substrate 36 and the polymer film on the silicon substrate 36 is etched quickly.

Figure 18:
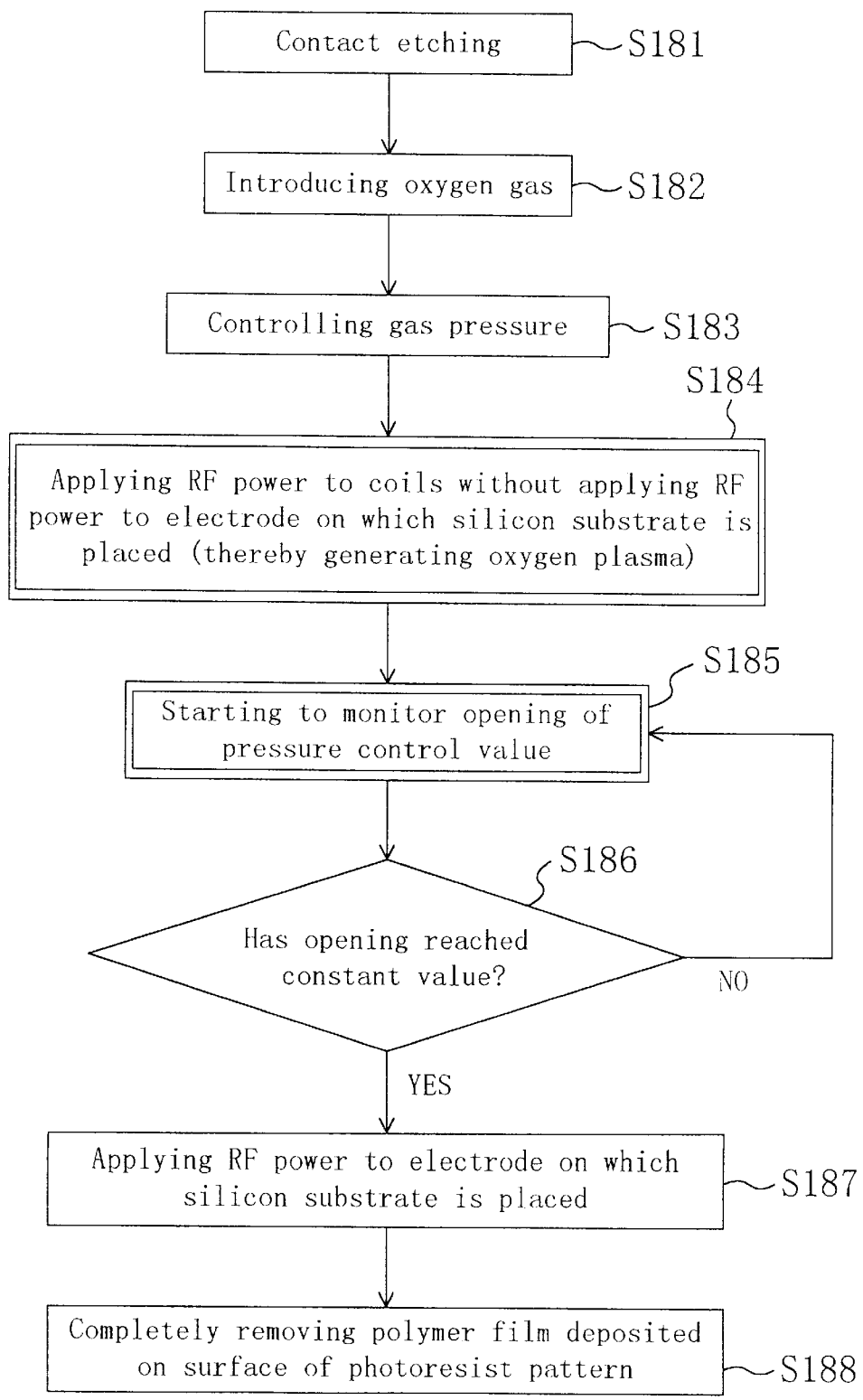
FIG. 18 is a flow chart illustrating process steps for fabricating a semiconductor device in the fourth embodiment of the present invention.

Next, with reference to FIG. 18, it will be described how the process is performed in this embodiment.

In Step S181, a contact hole is formed by etching.

In Step S182, oxygen gas is introduced into the reaction chamber 37.

In Step S183, the pressure of the oxygen gas is controlled by adjusting the opening of the pressure control valve 38.

In Step S184, while no RF power is applied to the lower electrode 33 on which the silicon substrate 36 is placed, RF power is applied by the RF power supply 32 to the coils 31, thereby generating oxygen plasma.

In Step S185, while fluorine attached to the inner sidewall of the reaction chamber 37 and the polymer film deposited on the bottom of the contact hole are removed, the opening of the pressure control valve 38 is monitored.

If it is determined in Step S186 that the opening has reached a constant value, then RF power is applied in Step S187 to the lower electrode 33 supporting the silicon substrate 36, thereby applying a bias voltage to the silicon substrate 36. As a result, the silicon substrate 36 is bombarded with oxygen ions in the oxygen plasma.

In Step S188, the polymer film deposited on the surface of the photoresist is completely removed.

Figure 19:
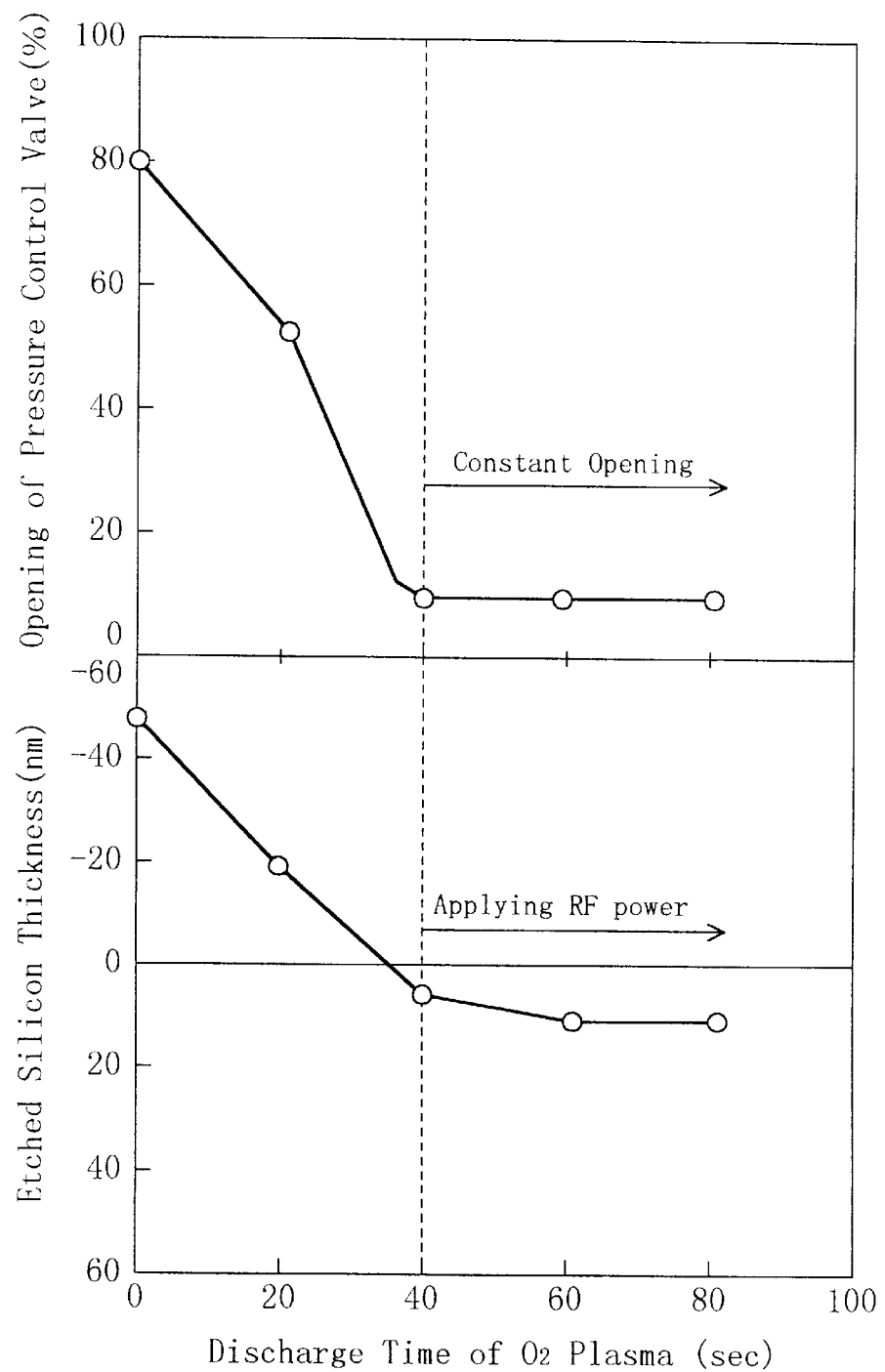
FIG. 19 is a graph illustrating a relationship between a discharge time of oxygen plasma and an opening of a pressure control valve and a relationship between a discharge time of oxygen plasma and an etched silicon thickness.

FIG. 19 illustrates a relationship between a discharge time of oxygen plasma and an opening of the pressure control valve 38 and a relationship between the discharge time of oxygen plasma and an etched silicon thickness. In the lower part of FIG. 19, negative values on the axis of ordinates represent the thicknesses of the polymer film, while positive values represent etched silicon thicknesses.

In this embodiment, after the opening of the pressure control valve 38 has reached a constant value, a bias voltage is applied to the silicon substrate 36. As will be described later, the time the opening of the pressure control valve 38 has reached a constant value is synchronous with the time fluorine has completely disappeared from the reaction chamber 37. As can be understood from FIG. 19, the diffusion layer is hardly etched in this embodiment.

Next, it will be described why the time the opening of the pressure control valve 38 has reached a constant value is synchronous with the time fluorine has completely disappeared from the reaction chamber 37.

After a contact hole has been formed by etching, when oxygen plasma is generated, fluorine attached to the sidewall of the reaction chamber 37 is released into the oxygen plasma. As a result, the pressure inside the reaction chamber 37 rises. Then, in order to control the pressure at a constant value, the pressure control valve 38 opens wider. Thereafter, as the amount of fluorine gradually decreases, the pressure inside the reaction chamber 37 also gradually decreases. Correspondingly, the opening of the pressure control valve 38 gradually decreases to reach a constant value before long. Thus, the variation of the amount of fluorine can be monitored based on the opening of the pressure control valve 38.

In this embodiment, the variation of the amount of fluorine is monitored based on the opening of the pressure control valve 38. And at a point in time the CPU 83 senses that the opening of the pressure control valve 38 has reached a constant value, the application of a bias voltage to the silicon substrate is started. Accordingly, fluorine can be removed efficiently. Also, the ON/OFF states of the RF power supply used for applying the bias voltage are also controlled based on the opening of the pressure control valve 38. Thus, even if the time taken to remove fluorine has changed, the oxygen plasma processing on the substrate can be started at an optimum time.

EMBODIMENT 5

Hereinafter, a dry etching apparatus used in the fifth embodiment will be described with reference to FIG. 20.

Figure 20:
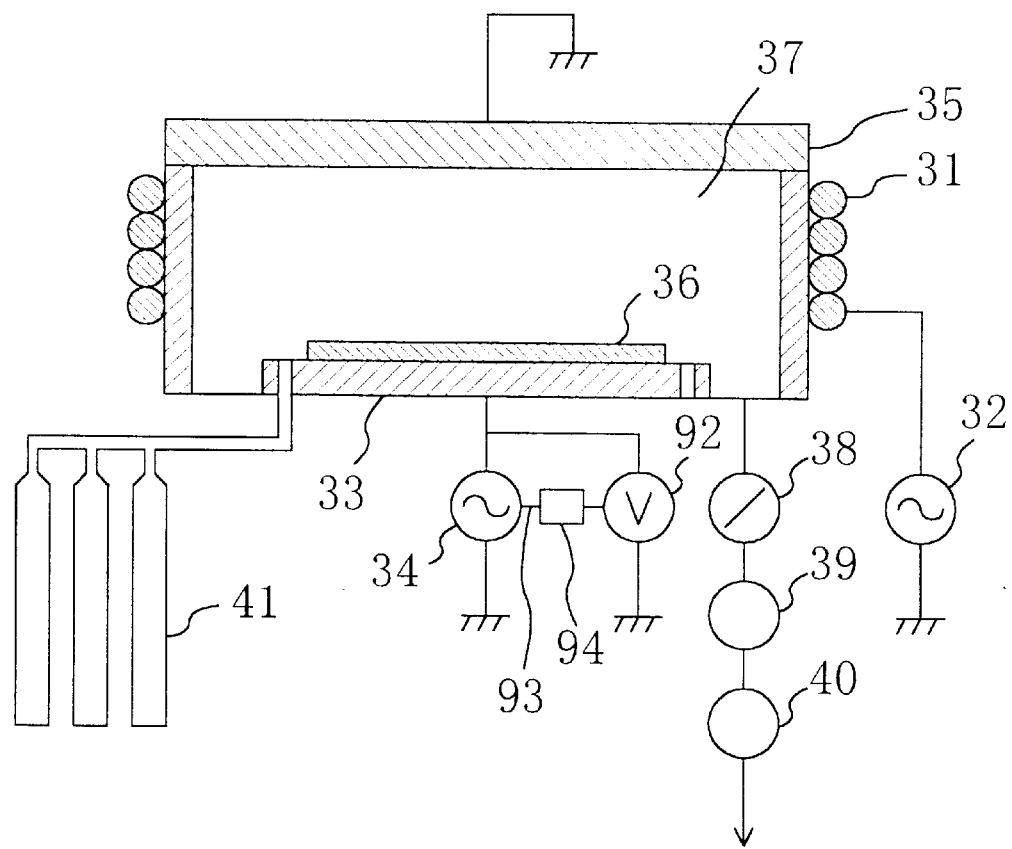
FIG. 20 is a schematic representation of an etching apparatus used in the fifth embodiment of the present invention.

The apparatus shown in FIG. 20 has fundamentally the same structure as that of the dry etching apparatus shown in FIG. 3. The former apparatus is different from the latter apparatus in that the former apparatus further includes a voltmeter 92, a signal line 93 and a CPU 94.

In this embodiment, after the apparatus shown in FIG. 20 has performed a contact etching process step, first, oxygen gas is introduced from the gas cylinders 41 into the reaction chamber 37 and RF power is applied by the RF power supply 32 to the coils 31, thereby generating plasma. Next, the voltage of the lower electrode 33 is measured by the voltmeter 92. The CPU 94 identifies a point in time the measured voltage has reached a constant value. And at the point in time, the CPU 94 transmits a signal to the RF power supply 34 through the signal line 93, thereby activating the RF power supply 34. In response thereto, the RF power supply 34 starts to operate and applies RF power to the lower electrode 33. As a result, the etching species (positive ions) in the plasma are attracted to the silicon substrate 36 and the polymer film on the silicon substrate 36 is etched.

Figure 21:
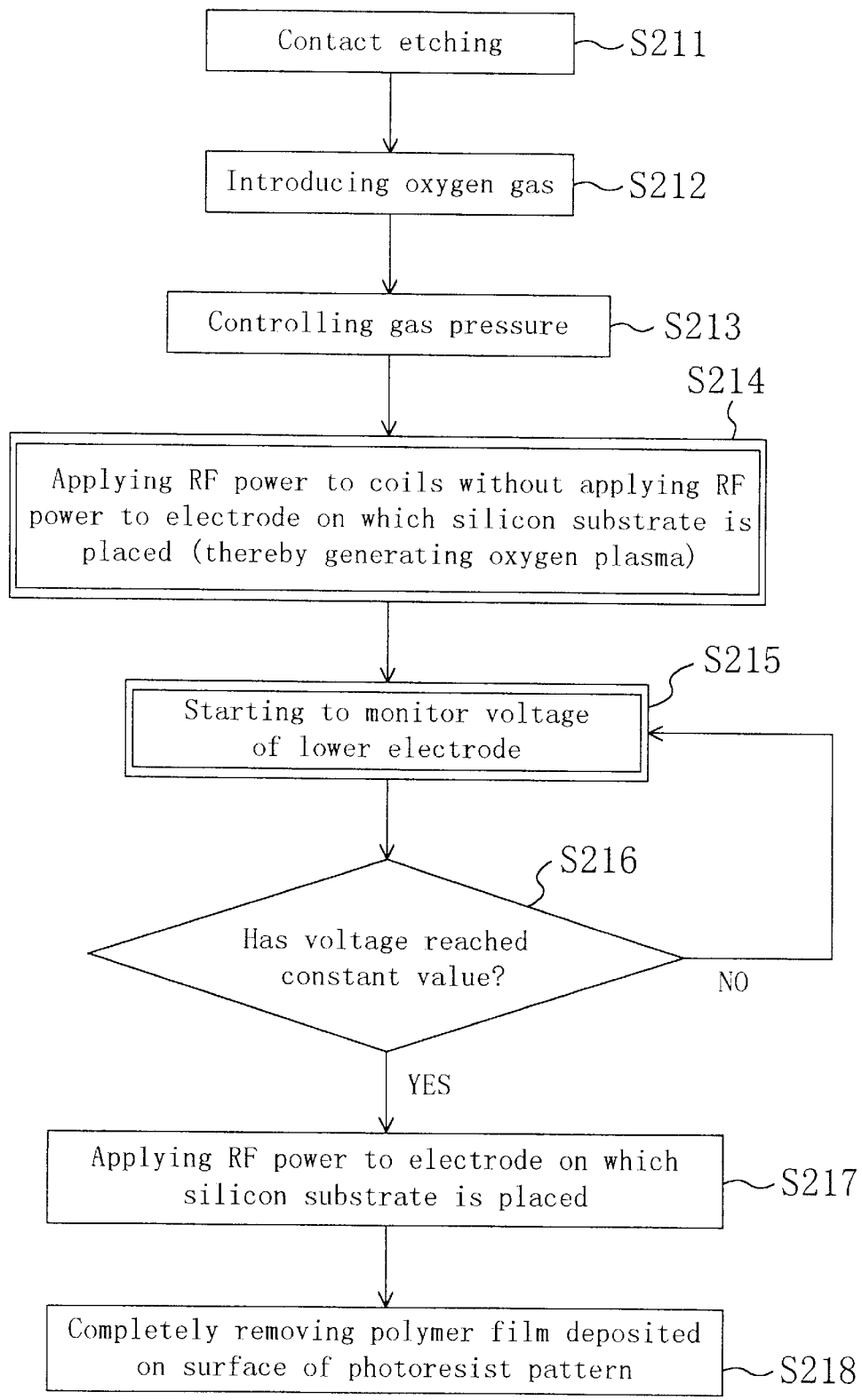
FIG. 21 is a flow chart illustrating process steps for fabricating a semiconductor device in the fifth embodiment of the present invention.

Next, with reference to FIG. 21, it will be described how the process is performed in this embodiment.

In Step S211, a contact hole is formed by etching.

In Step S212, oxygen gas is introduced into the reaction chamber 37.

In Step S213, the pressure of the oxygen gas is controlled by adjusting the opening of the pressure control valve 38.

In Step S214, while no RF power is applied to the lower electrode 33 on which the silicon substrate 36 is placed, RF power is applied by the RF power supply 32 to the coils 31, thereby generating oxygen plasma.

In Step S215, while fluorine attached to the inner sidewall of the reaction chamber 37 and the polymer film deposited on the bottom of the contact hole are removed, the voltage of the lower electrode 33 is monitored.

If it is determined in Step S216 that the voltage of the lower electrode 33 has reached a constant value, then RF power is applied in Step S217 to the lower electrode 33, thereby applying a bias voltage to the silicon substrate 36. As a result, the silicon substrate 36 is bombarded with oxygen ions in the oxygen plasma.

In Step S218, the polymer film deposited on the surface of the photoresist is completely removed.

Next, it will be described based on the results of measurement how much the diffusion layer is etched in accordance with the dry etching method of this embodiment.

Figure 22:
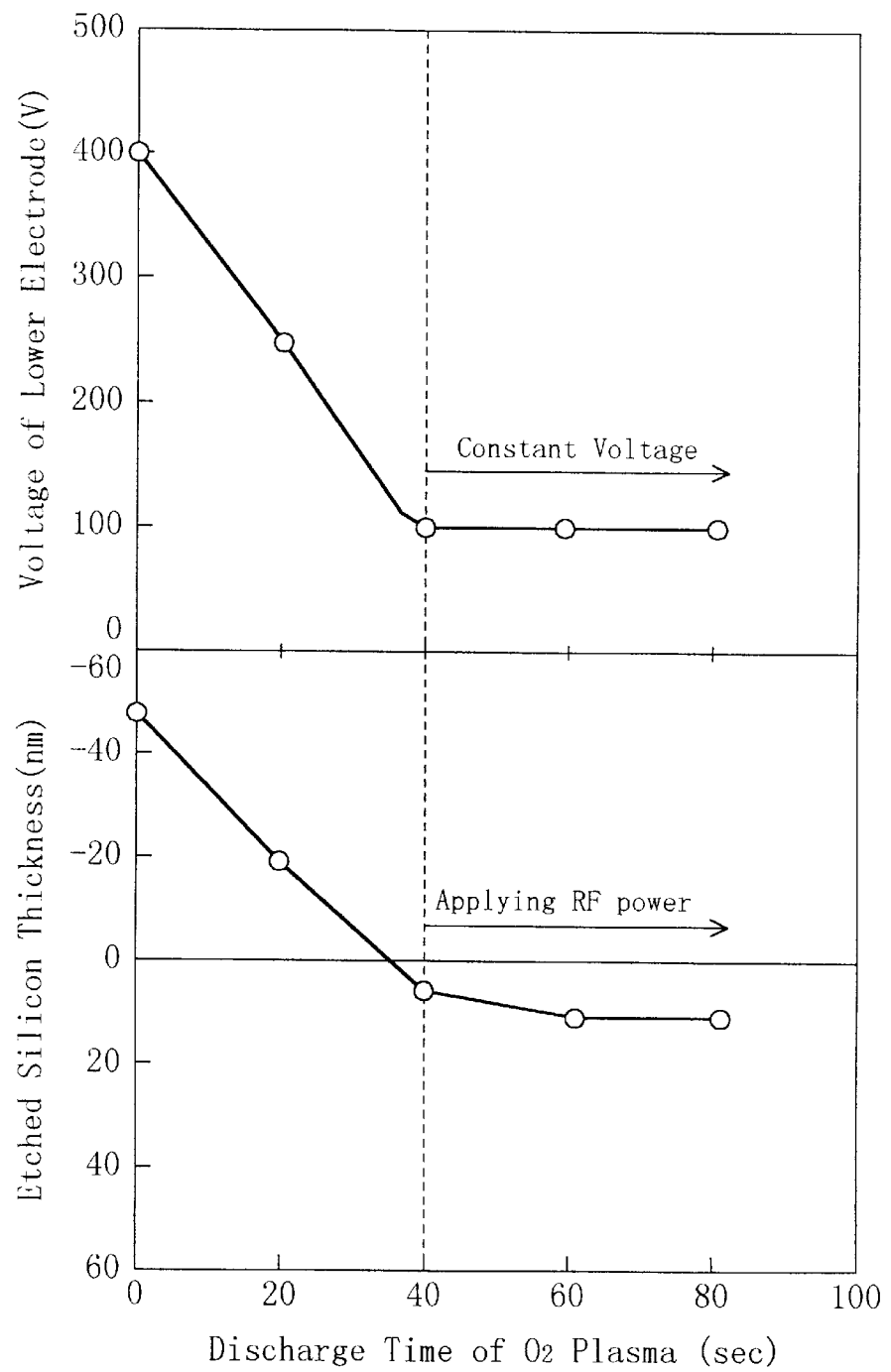
FIG. 22 is a graph illustrating a relationship between a discharge time of oxygen plasma and a voltage of a lower electrode and a relationship between a discharge time of oxygen plasma and an etched silicon thickness.

FIG. 22 illustrates a relationship between a discharge time of oxygen plasma and a voltage of the lower electrode 33 and a relationship between the discharge time of oxygen plasma and an etched silicon thickness.

In the lower part of FIG. 22, negative values on the axis of ordinates represent the thicknesses of the polymer film, while positive values represent etched silicon thicknesses. In this embodiment, after the voltage of the lower electrode 33 has reached a constant value, a bias voltage is applied to the silicon substrate 36. As will be described later, the time the voltage of the lower electrode 33 has reached a constant value is synchronous with the time fluorine has completely disappeared from the reaction chamber 37. As can be understood from FIG. 22, the diffusion layer is hardly etched in this embodiment.

Next, it will be described why the time the voltage of the lower electrode 33 has reached a constant value is synchronous with the time fluorine has completely disappeared from the reaction chamber 37.

After a contact hole has been formed by etching, when oxygen plasma is generated, fluorine attached to the sidewall of the reaction chamber 37 is released into the oxygen plasma. As a result, the pressure of the plasma inside the reaction chamber 37 rises and the density of the plasma increases. As the density of the plasma increases, the resistance of the plasma decreases. Assume the upper electrode 35 is a ground, the plasma is a resistor and the current flowing into/out of the lower electrode 33 is constant. In such a case, the smaller the resistance of the plasma becomes, the higher the voltage applied from the RF power supply 34 to the plasma becomes. Conversely, as the pressure of the plasma decreases with the exhaustion of fluorine, the density of the plasma also decreases. As a result, the voltage applied to the plasma becomes lower. Accordingly, the voltage of the lower electrode 33 is high immediately after fluorine has been released into the oxygen plasma. Thereafter, as fluorine is exhausted, the voltage decreases. And at a time fluorine has been completely exhausted from the reaction chamber 37, the voltage of the lower electrode 33 reaches a constant value. Thus, the variation of the amount of fluorine can be monitored based on the voltage of the lower electrode 33. In this embodiment, at a point in time the CPU 94 senses that the voltage of the lower electrode 33 has reached a constant value, the CPU 94 activates the RF power supply 34, which starts to apply a bias voltage to the silicon substrate 36.

In this embodiment, the voltage of the lower electrode 33 is measured and the operation of the RF power supply 34 is started in response to a signal indicating that the voltage has reached a constant value, thereby starting the application of a bias voltage to the silicon substrate. Accordingly, fluorine can be removed efficiently. Also, even if the time taken to remove fluorine has changed, the bombardment of oxygen ions in the oxygen plasma onto the substrate can be started at an optimum time.

EMBODIMENT 6

If plasma in which the ratio of fluorine to carbon is 2 or less (hereinafter, such plasma will be called "carbon-rich plasma") is used to increase the etch selectivity with respect to a photoresist, then a polymer film is more likely to be deposited on the inner wall of a reaction chamber.

The polymer film deposited on the inner wall of the reaction chamber is mainly composed of carbon (C) and fluorine (F). In a fluorocarbon gas used for etching a silicon dioxide ($SiO_2$) film, the higher the ratio of C is, the higher the deposition rate of a polymer film is. In etching an $SiO_2$ film by using a fluorocarbon gas in which the ratio of F to C is 2 or less, the larger number of times etching is performed (i.e., the larger number of wafers are etched), the thicker the polymer film deposited inside the reaction chamber becomes. The present inventors found that if etching is repeatedly performed by using gaseous plasma in which the ratio of F to C is 2 or less, then C contained in the polymer film on the inner wall of the reaction chamber is supplied into the plasma and the amount of C in the plasma increases during the etching process. We also observed based on experiments that in accordance with a conventional dry etching method, if the amount of C in the plasma increases in this manner, then the etching depth gradually decreases as etching is performed the larger number of times. This is because the thickness of the polymer film deposited on the bottom of the contact hole being etched increases with the increase of C in the plasma.

Hereinafter, a dry etching apparatus used in the sixth embodiment will be described with reference to FIG. 23.

Figure 23:
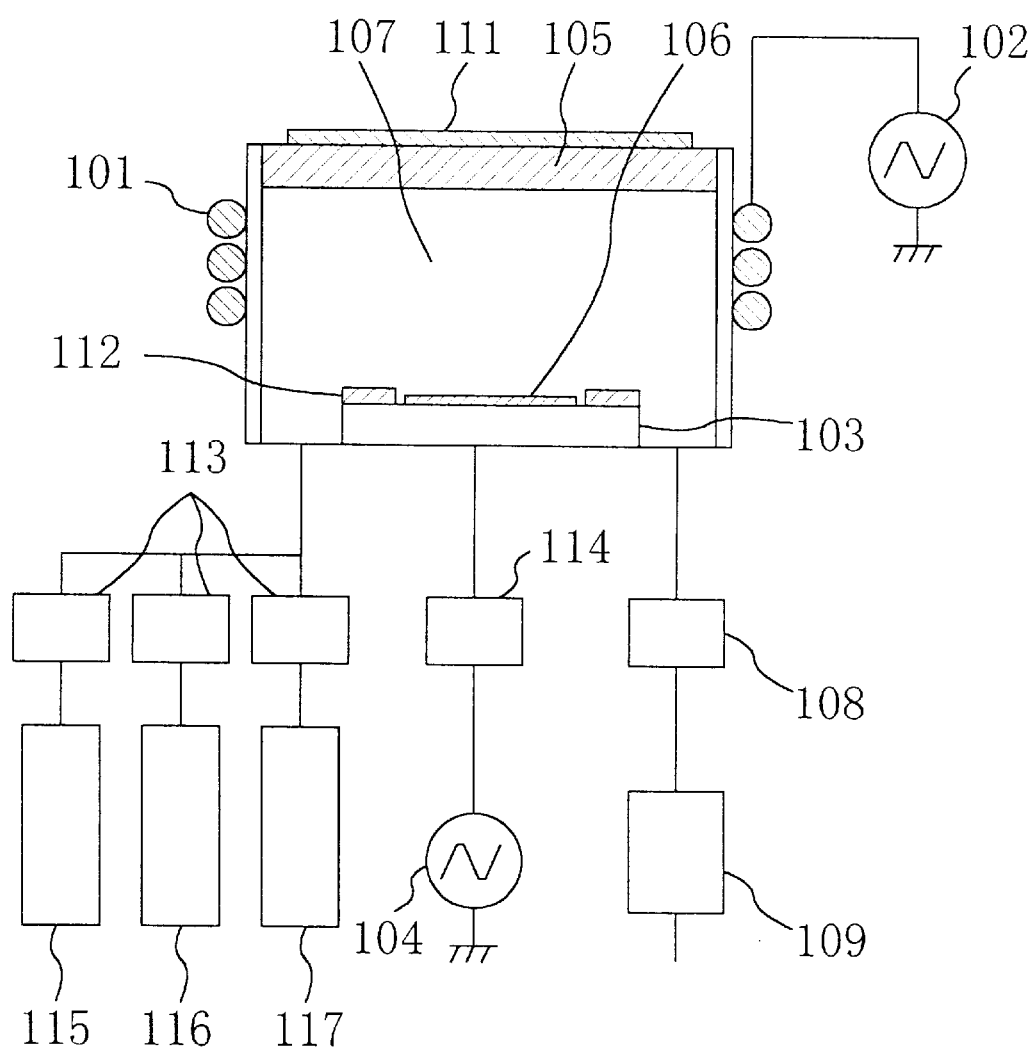
FIG. 23 is a schematic representation of a dry etching apparatus used in the method for fabricating a semiconductor device of the present invention.

FIG. 23 is a schematic representation of a dry etching apparatus using inductively coupled plasma. The dry etching apparatus shown in FIG. 23 includes a reaction chamber 107 in which dry etching is performed. The outer sidewall of the reaction chamber 107 is surrounded by induction coils 101 used for generating plasma in the reaction chamber 107. The induction coils 101 are connected to an RF power supply 102 and are supplied with RF power (frequency: 1.8 MHz) from the RF power supply 102.

On the bottom of the reaction chamber 107, a lower electrode 103 supporting a substrate to be processed (silicon substrate) 106 is provided. The lower electrode 103 is connected to an RF power supply 104 via a matcher 114 and is supplied with RF power from the RF power supply 104. A quartz ring 112 is placed on the periphery of the upper surface of the lower electrode 103. On the ceiling of the reaction chamber 107, an upper electrode 105, made of silicon, for example, is provided. Also, a heater 111 is provided on the reaction chamber 107 to heat the chamber 107 if necessary.

Between an outlet port of the reaction chamber 107 and the outside, a pressure control valve 108 and an exhaust pump 109 are inserted. A mixed gas ($C_4F_8/CH_2F_2/CO/Ar$) obtained by adding CO and Ar to $C_4F_8$ and $CH_2F_2$, which are fluorocarbon gases, is introduced into the reaction chamber 107 via mass flow controllers 113. Respective gases to constitute the etching gas are stored in a plurality of cylinders 115, 116 and 117. The etching gas is exhausted out of the apparatus through the outlet port, the pressure control valve 108 and the exhaust pump 109. The pressure control valve 108 operates in such a manner as to maintain the pressure inside the reaction chamber 107 at a predetermined value within the range from 1 mTorr to 500 mTorr.

Next, a method for fabricating a semiconductor device, including a dry etching step performed by using this apparatus, will be described with reference to FIGS. 24A through 24D and FIG. 25, in addition to FIG. 23. FIG. 25 illustrates how the process is performed in this embodiment.

Figure 24A:
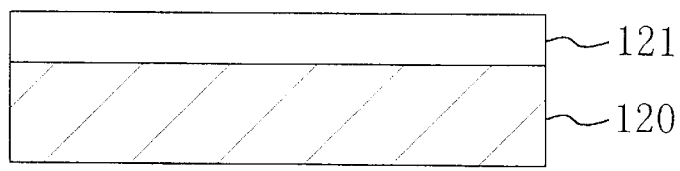
FIGS. 24A through 24D are cross-sectional views illustrating intermediate process steps of the method for fabricating a semiconductor device of the present invention.
Figure 24B:
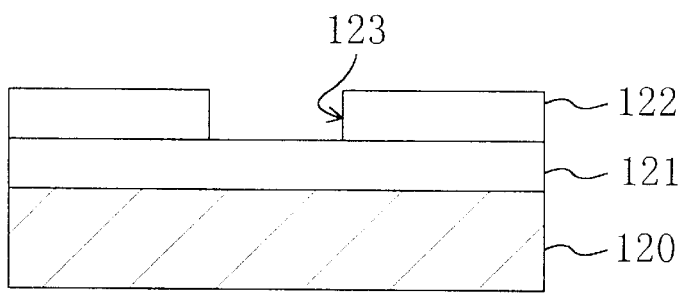
Figure 25:
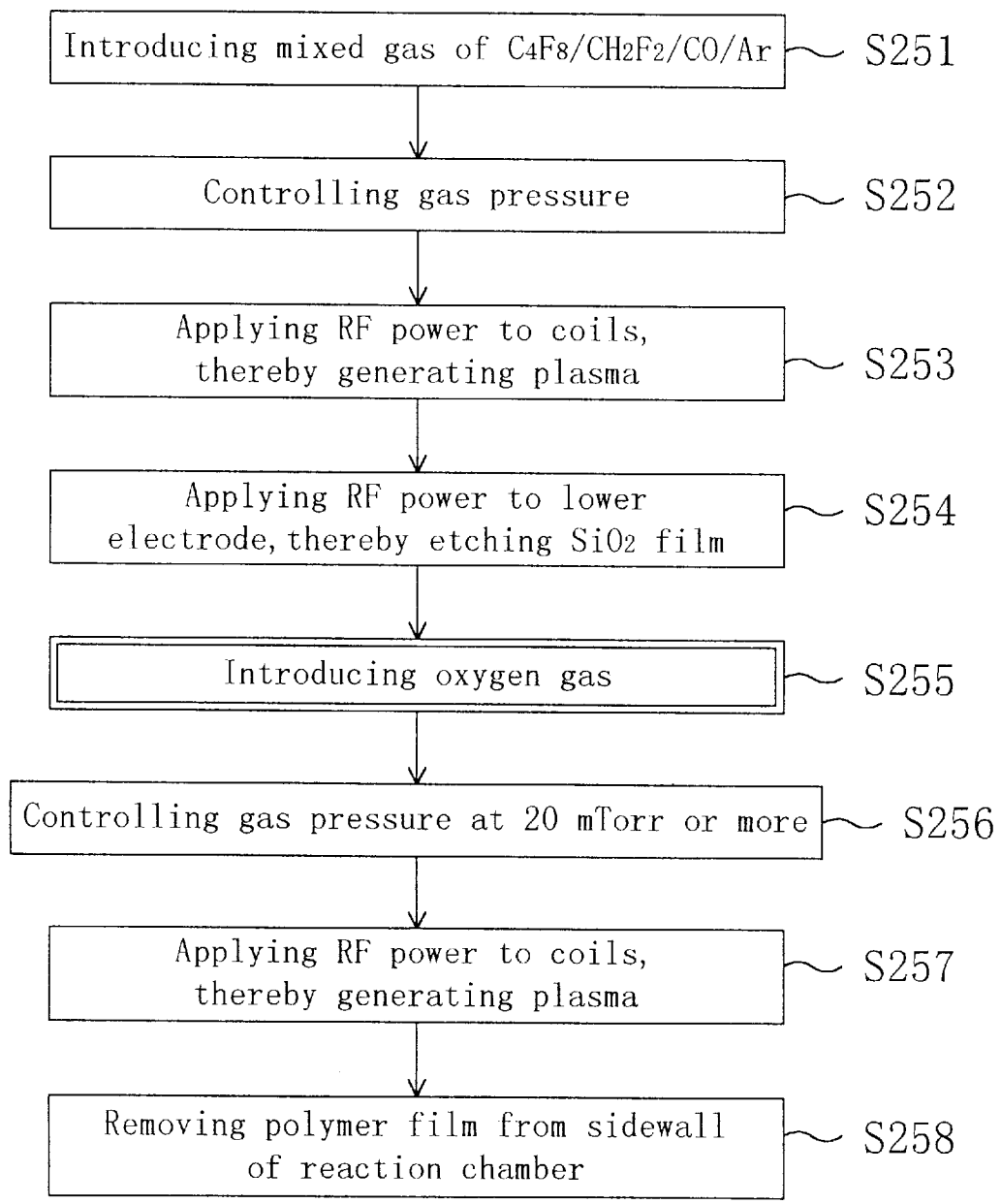
FIG. 25 is a flow chart illustrating process steps for fabricating a semiconductor device in the sixth embodiment of the present invention.

First, as shown in FIG. 24A, a silicon substrate 120, on which a semiconductor element such as a transistor (not shown) has been formed or is being formed, is prepared. Next, by a known thin film deposition technique, an $SiO_2$ film 121 is deposited on the silicon substrate 120. Thereafter, by a photolithography technique, a photoresist pattern 122 is defined on the $SiO_2$ film 121 as shown in FIG. 24B. In order to attain high resolution, the thickness of the photoresist pattern 122 is set at a relatively small value. e.g., in the range from 0.5 μm to 1.0 μm. This photoresist pattern 122 has an opening 123 defining the shape and position of a contact hole to be formed.

Next, the silicon substrate 120 with the photoresist pattern 122 defined on the surface thereof is placed in the reaction chamber 107 of the dry etching apparatus shown in FIG. 23. Thereafter, the mixed gas of $C_4F_8/CH_2F_2/CO/Ar$ is introduced into the reaction chamber 107 (in Step S251 in FIG. 25), and the pressure of the gas is controlled at a value between 1 mTorr and 50 mTorr (in Step S252).

Subsequently, RF power at a level between 1000 W and 3000 W is applied to the induction coils 101, thereby generating plasma (in Step S253). In the plasma, other kinds of molecules, excited atoms and ions, produced from the mixed gas, are also contained. In this embodiment, high-density plasma is generated at a density of $10^{11}$ cm$^{-3}$ or more.

Figure 24C:
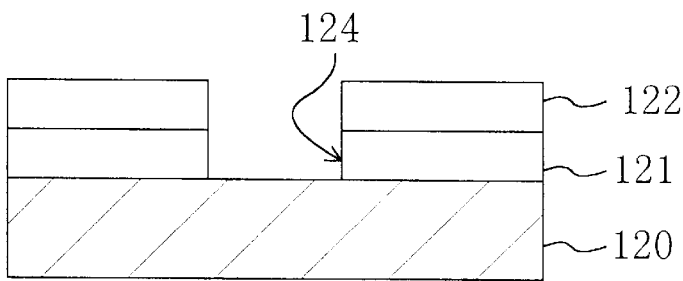

Then, RF power between 100 W and 2000 W is applied to the lower electrode 103, thereby applying a negative self-bias to the substrate 106 (i.e., the silicon substrate 120 shown in FIG. 24) and etching the $SiO_2$ film 121 (in Step S254). In this manner, a contact hole 124 is formed in the $SiO_2$ film 121 as shown in FIG. 24C. The contact hole 124 reaches an impurity diffusion layer (not shown) formed in the silicon substrate 120, thereby enabling electrical contact between an interconnection formed on the $SiO_2$ film 121 and the impurity diffusion layer in the silicon substrate 120. The impurity diffusion layer may be a silicide layer.

After the contact hole has been formed by etching, oxygen gas is introduced into the reaction chamber 107 (in Step S255). In order to remove a polymer film with higher efficiency, the flow rate of the oxygen gas introduced is preferably 100 sccm or more. More preferably, the flow rate is set at 200 sccm in practice. While controlling the gas pressure at 20 mTorr or more (in Step S256), RF power between 1000 W and 3000 W is applied to the induction coils 101, thereby generating oxygen plasma (in Step S257). It is in order to stabilize the discharge and remove the polymer film with higher efficiency that the gas pressure is set at 20 mTorr or more. And the polymer film attached to the inner wall of the reaction chamber 107 is oxidized and removed by the oxygen plasma (in Step S258). While the oxygen plasma is being formed, no RF power is applied to the lower electrode 103. If RF power is applied to the lower electrode 103, then the silicon substrate is bombarded with positive ions in the oxygen plasma. In this embodiment, the oxygen plasma is used to dissolve the polymer film on the inner wall of the reaction chamber 107. Thus, the positive ions need not be supplied to the silicon substrate. It is noted that the "polymer film" is not always a continuous film having a uniform thickness. In this specification, so long as polymers are attached on the inner wall of the reaction chamber, these polymers will be called a "polymer film" collectively, no matter whether these polymers are discontinuous or porous.

These Steps S255 to S258 are process steps for controlling the environment inside the reaction chamber (hereinafter, these process steps will be called a "reaction chamber environment control step" collectively).

Figure 24D:
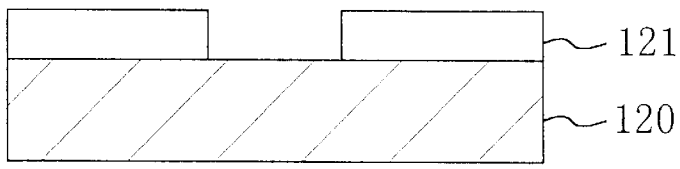

Next, as shown in FIG. 24D, the photoresist pattern 122 is removed. The photoresist pattern 122 may be removed by using the oxygen plasma in the reaction chamber 107. In such a case, a negative bias is preferably applied to the substrate by supplying RF power to the lower electrode 103. This is because the time taken to remove the photoresist pattern can be shortened by the ion bombardment. Thereafter, a semiconductor device is fabricated in accordance with a known fabrication process.

Figure 26:
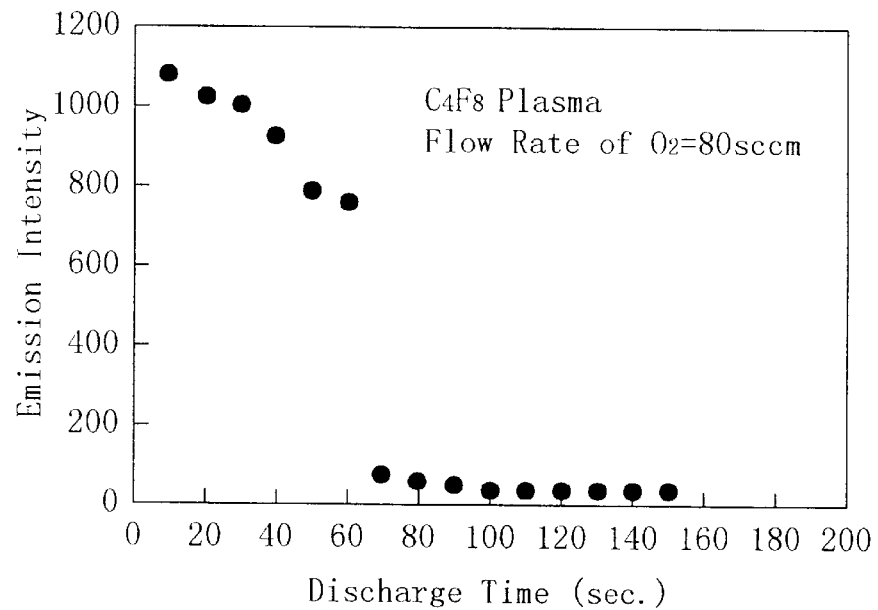
FIG. 26 is a graph illustrating the variation of an optical emission intensity (flow rate of oxygen: 80 sccm) in the sixth embodiment of the present invention.

FIG. 26 illustrates the optical emission intensity of $C_2$ (wavelength: 516 nm) in the reaction chamber environment control step, in which dry etching has been performed in accordance with the procedure shown in FIG. 25. In FIG. 26, the axis of ordinates represents the time of discharge in the reaction chamber environment control step. As can be understood from FIG. 26, if the flow rate of oxygen is 800 sccm, it takes about 80 seconds until the optical emission intensity of $C_2$ decreases to reach a sufficiently low level. The time the optical emission intensity has reached a sufficiently low level is synchronous with a time the polymer film deposited on the wall of the reaction chamber has been substantially removed.

Figure 27:
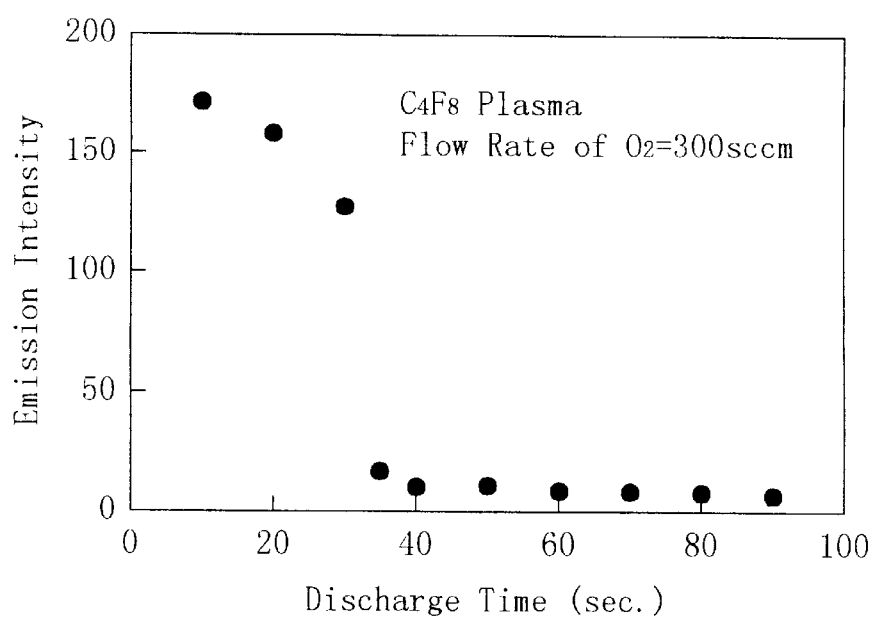
FIG. 27 is a graph illustrating the variation of an optical emission intensity (flow rate of oxygen: 300 sccm) in the sixth embodiment of the present invention.

FIG. 27 also illustrates the optical emission intensity of $C_2$ (wavelength: 516 nm) in the reaction chamber environment control step. In the reaction chamber, dry etching is performed on the same conditions as those used for obtaining the data shown in FIG. 26 except that the flow rate of oxygen is changed from 80 sccm into 300 sccm. In FIG. 27, the axis of ordinates also represents the time of discharge in the reaction chamber environment control step.

As can be understood from FIG. 27, at a time 40 seconds have passed since the discharge started, the optical emission intensity reaches a sufficiently low level. Accordingly, by increasing the flow rate of oxygen, the time taken to control the environment in FIG. 27 can be about one half of that taken in FIG. 26. Thus, increasing the flow rate of oxygen is effective to the control of the environment inside the reaction chamber. It is particularly preferable that the flow rate of oxygen is 300 sccm or more. However, even if the flow rate is 200 sccm or more, the polymer film can be removed with sufficiently high efficiency.

Figure 28:
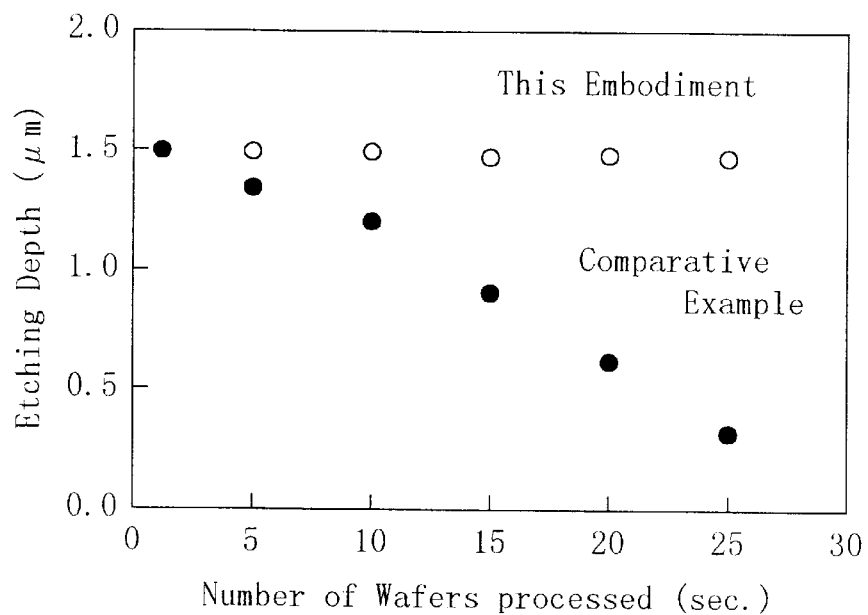
FIG. 28 is a graph illustrating the variation of an etching depth in the sixth embodiment of the present invention.

FIG. 28 illustrates the etching characteristics (the dependence of an etching depth on the number of wafers processed) where a contact hole having a diameter of about 0.2 μm is formed in a silicon dioxide film having a thickness of 2.0 μm, most of which is covered with a photoresist. In FIG. 28, data are shown for a case where the reaction chamber environment control step is performed (this embodiment) and a case where the step is not performed (comparative example). In etching 25 wafers, in the comparative example, as the number of wafers processed increases, the etching depth becomes shallower. As a result, the contact hole cannot be opened satisfactorily. By contrast, in this embodiment, since the reaction chamber environment control step is performed, the amount of carbon in plasma can be kept constant throughout the etching process repeatedly performed. As a result, the etching depth is substantially constant.

Figure 29:
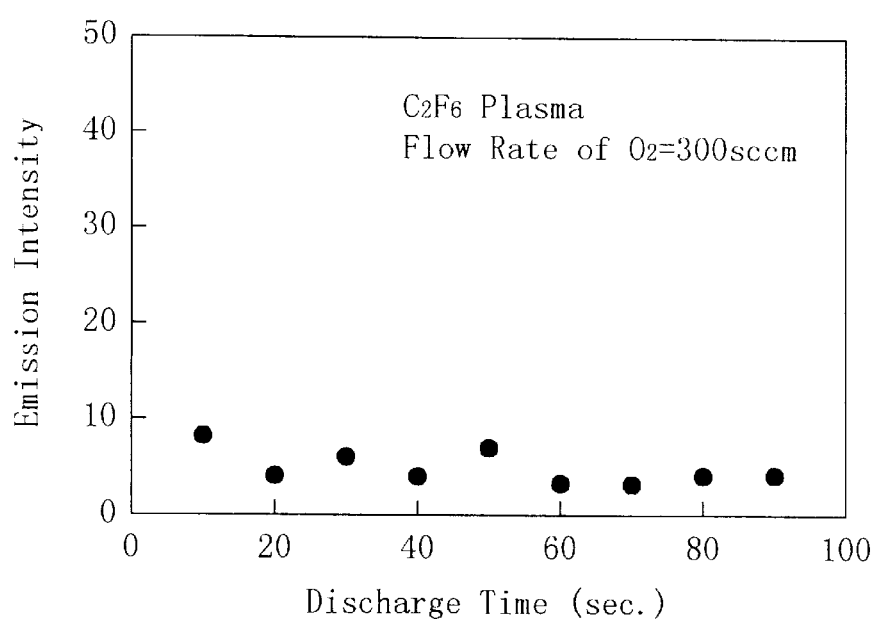
FIG. 29 is a graph illustrating the variation of an optical emission intensity in a comparative example in which a gas containing carbon at a low percentage is used.

FIG. 29 illustrates the time-dependent variation of the optical emission intensity of $C_2$ during oxygen plasma processing, in which a fluorocarbon gas where the ratio of fluorine to carbon is larger than 2 (a gas containing carbon at a low percentage) is used (prior art example).

In this example, an oxide film is etched by using $C_2F_2$ as the gas containing carbon at a low percentage, and oxygen is continuously introduced into the same reaction chamber at a low rate of 300 sccm, thereby generating oxygen plasma. As an be understood from FIG. 29, substantially no optical emission of carbon is detected from the beginning, and therefore the reaction chamber environment control step is not necessary. This plasma is not carbon rich, because the ratio of fluorine to carbon is larger than 2 in this gas (in $C_2F_6$, the ratio is 3). Accordingly, the present invention is very effectively applicable to plasma etching using a gas in which the ratio of fluorine to carbon is larger than 2.

In this embodiment, the polymer film deposited on the inner wall of the reaction chamber is removed after contact etching has been performed. Alternatively, the polymer film deposited on the inner wall of the reaction chamber may be removed at any arbitrary time before contact etching is performed on the next wafer.

It is noted that a step of removing a polymer film (not shown) formed on the bottom (substrate surface) of the contact hole 124 shown in FIG. 24C may be performed separately after contact etching has been performed. This process step can be carried out by applying RF power to the lower electrode 103 with the generation of oxygen plasma, for example. By applying RF power to the lower electrode 103, a negative bias is applied to the substrate and positive ions in the oxygen plasma are sufficiently supplied to the bottom of the contact hole 124. As a result, the polymer film on the bottom is removed smoothly. Such a removal of the polymer film is very effective to the prevention of a contact failure. This process step may be performed either before or after the reaction chamber environment control step. However, the step of partially exposing the surface of the silicon substrate 120 by removing the polymer film from the bottom of the contact hole 124 is preferably performed after the environment inside the reaction chamber has been controlled at a predetermined standard by performing the reaction chamber environment control step.

If the reaction chamber environment control step is performed posterior to the step of removing the polymer film from the bottom of the contact hole 124, the reaction chamber environment control step may be performed after the silicon substrate has been taken out of the reaction chamber. The reaction chamber environment control step is preferably performed every time the contact etching step has been performed. Alternatively, the reaction chamber environment control step may be performed every time the same etching process has been performed a predetermined number of times. The purpose of the reaction chamber environment control step is dissolving and removing the polymer film being formed on the inner wall of the reaction chamber before the polymer film grows to have such a thickness as affecting the plasma during the etching process. Accordingly, the reaction chamber environment control step is not always performed immediately after contact etching has been performed. However, it is preferable to program such that a series of process steps such as etching and control of the environment inside the reaction chamber are performed continuously.

EMBODIMENT 7

Hereinafter, a method for fabricating a semiconductor device in the seventh embodiment of the present invention will be described.

Figure 30:
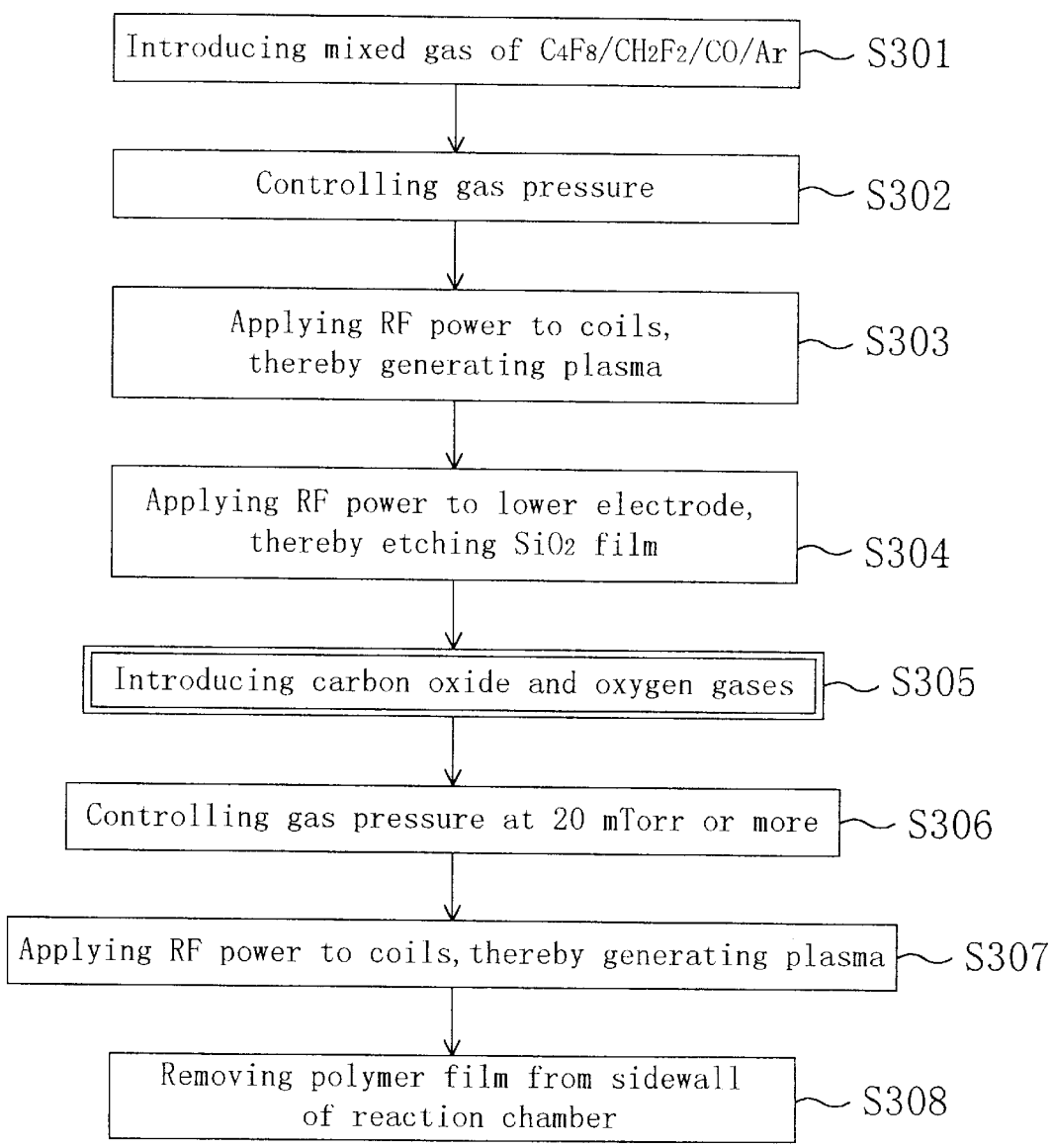
FIG. 30 is a flow chart illustrating process steps for fabricating a semiconductor device in the seventh embodiment of the present invention.

FIG. 30 illustrates the procedure employed in carrying out the method for fabricating a semiconductor device of this embodiment. In this embodiment, dry etching may be performed by using the apparatus shown in FIG. 23.

First, in the same way as in the sixth embodiment, as shown in FIG. 24A, a silicon substrate 120, on which a semiconductor element such as a transistor (not shown) has been formed or is being formed, is prepared.

Next, by a known thin film deposition technique, an $SiO_2$ film 121 is deposited on the silicon substrate 120. Thereafter, by a photolithography technique, a photoresist pattern 122 is defined on the $SiO_2$ film 121.

Next, the substrate 120 with the photoresist pattern 122 defined on the surface thereof is placed in the reaction chamber 107 of the dry etching apparatus shown in FIG. 23. Thereafter, a mixed gas of $C_4F_8/CH_2F_2/CO/Ar$ is introduced into the reaction chamber 107 (in Step S301 in FIG. 30), and the pressure of the gas is controlled at a value between 1 mTorr and 50 mTorr (in Step S302).

Subsequently, RF power at a level between 1000 W and 3000 W is applied to the induction coils 101, thereby generating plasma (in Step S303). Then, RF power between 100 W and 2000 W is applied to the lower electrode 103, thereby performing etching (in Step S304). After etching is finished, carbon oxide and oxygen gases are introduced into the reaction chamber 107 at respective flow rates of 200 sccm or more and 80 sccm or more (in Step S305). While controlling the gas pressure at 20 mTorr or more (in Step S306), RF power between 1000 W and 3000 W is applied to the induction coils 101, thereby generating oxygen plasma (in Step S307). And the polymer film attached to the inner wall of the reaction chamber 107 is removed (in Step S308).

These Steps S305 to S308 correspond to the reaction chamber environment control step.

Carbon oxide reacts with fluorine contained in the polymer film and contributes to dissolving the polymer film. This reaction is represented by any of the following reaction formulae.

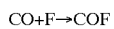

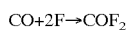

EMBODIMENT 8

Hereinafter, a method for fabricating a semiconductor device in the eighth embodiment of the present invention will be described.

Figure 31:
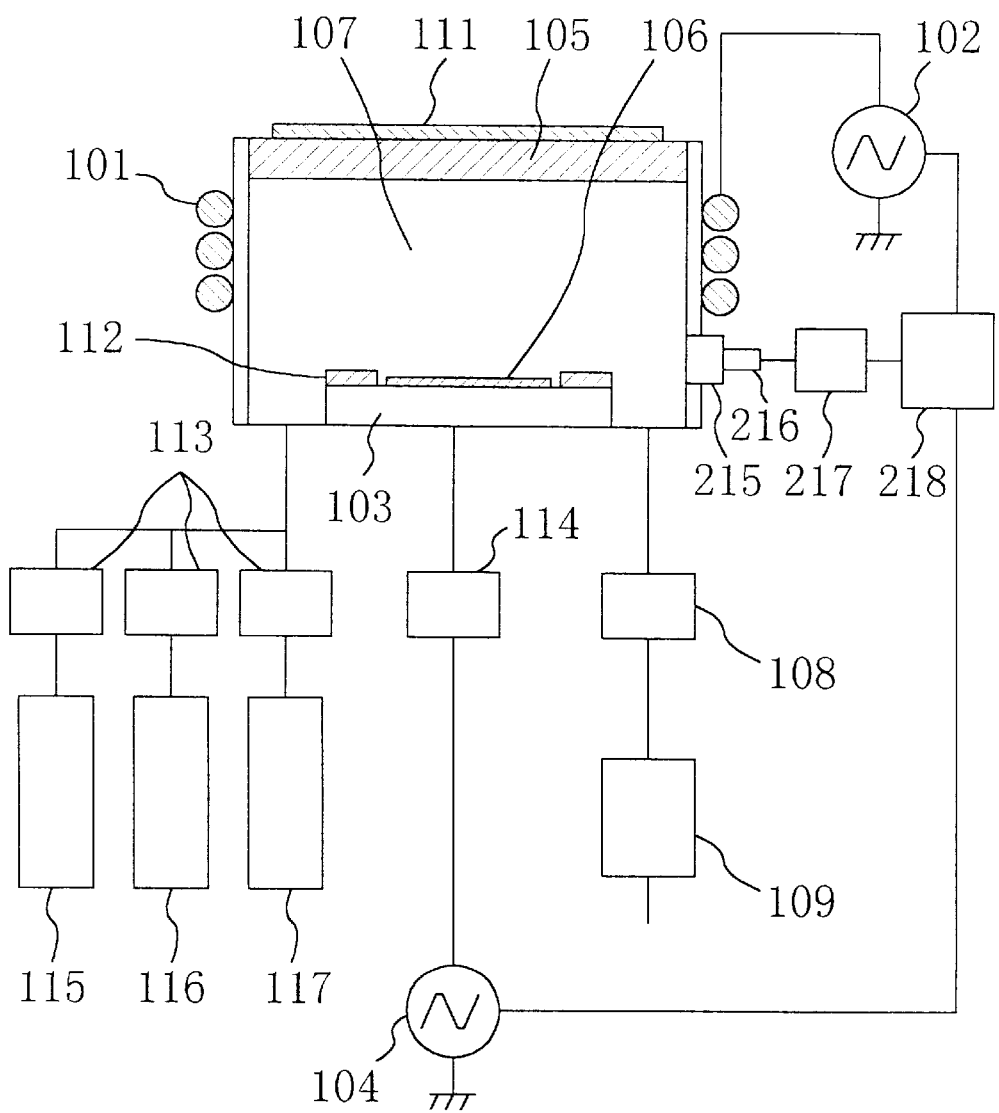
FIG. 31 is a schematic representation of an apparatus used in the eighth embodiment of the present invention.

FIG. 31 illustrates a method for monitoring an environment using an emission spectral analyzer.

A dry etching apparatus shown in FIG. 31 also uses inductively coupled plasma and has fundamentally the same structure as that of the apparatus shown in FIG. 23. Thus, the same components as those shown in FIG. 23 will be identified by the same reference numerals.

The dry etching apparatus shown in FIG. 31 also includes a reaction chamber 107 in which dry etching is performed. The outer sidewall of the reaction chamber 107 is surrounded by induction coils 101 used for generating plasma in the reaction chamber 107. The induction coils 101 are connected to an RF power supply 102 and are supplied with RF power from the RF power supply 102.

On the bottom of the reaction chamber 107, a lower electrode 103 supporting a substrate to be processed (silicon substrate) 106 is provided. The lower electrode 103 is connected to an RF power supply 104 via a matcher 114 and is supplied with RF power from the RF power supply 104. A quartz ring 112 is placed on the periphery of the upper surface of the lower electrode 103. On the top of the reaction chamber 107, an upper electrode 105, made of silicon, for example, is provided.

Between an outlet port of the reaction chamber 107 and the outside, a pressure control valve 108 and an exhaust pump to 109 are inserted. A mixed gas ($C_4F_8/CH_2F_2/CO/Ar$) obtained by adding CO and Ar to $C_4F_8$ and $CH_2F_2$ as fluorocarbon gases, is introduced into the reaction chamber 107 via mass flow controllers 113. The etching gas is exhausted out of the apparatus through the outlet port, the pressure control valve 108 and the exhaust pump 109. The pressure control valve 108 operates in such a manner as to maintain the pressure inside the reaction chamber 107 at a predetermined value within the range from 1 mTorr to 500 mTorr.

A light-receiving window 215 is provided for the reaction chamber 107. Light including the optical emission of $C_2$, oxygen and fluorine in the plasma is introduced through the light-receiving window 215 and a light-receiving portion 216 into an emission spectral analyzer (spectroscope) 217. The spectroscope 217 resolves each optical emission of $C_2$, oxygen and fluorine and measures the intensity of each emitted light. The measured intensities are processed by a computer 218. When the optical emission intensity decreases to be lower than a predetermined level, the computer 218 sends a deactivating signal to the RF power supplies 102 and 104, thereby terminating the reaction chamber environment control step.

In this manner, the environment inside the reaction chamber 107 can always be monitored and the time taken to perform the reaction chamber environment control step can be optimized.

In each of the foregoing embodiments, $C_4F_8$ is used as a gas in which the ratio of fluorine to carbon is 2 or less. Alternatively, the gas may be $C_5F_8$, $C_3F_6O$, $C_4F_6$ or the mixture thereof.

Also, in each of the foregoing embodiments, a silicon substrate is used as a substrate to be processed on which a silicon dioxide film is formed. Alternatively, any other substrate (e.g., a glass substrate) may be used. In using a glass substrate, however, the glass substrate itself is etched because glass is also mainly composed of silicon dioxide. If a polycrystalline or amorphous silicon film is formed on a glass substrate, a silicon dioxide film is formed thereon to cover the film and then a predetermined region of the silicon dioxide film is covered with a resist film, then the present invention can be carried out by using a glass substrate. It is highly probable that a semiconductor device, in which a thin film transistor is formed on a glass substrate or the like, will be integrated to a higher and higher degree. Accordingly, the application of the present invention to the fabrication of such a semiconductor device would expectedly procure us very preferable effects. In this specification, a "semiconductor device" is not limited to that including a semiconductor substrate as an indispensable element.

The method of the present invention includes the steps of: placing a substrate on an electrode provided inside a reaction chamber of a plasma etching apparatus, and etching an oxide film by using plasma generated from a gas including a fluorocarbon gas with a bias voltage applied to the substrate; and removing fluorine from the reaction chamber by generating oxygen plasma inside the reaction chamber with no bias voltage applied to the substrate. Thus, the polymers attached to the inner wall of the reaction chamber during the step of etching the oxide film can be dissolved and fluorine contained in the polymers can be removed from the reaction chamber. As a result, it is possible to prevent the surface of the silicon substrate, exposed by etching the oxide film, from being excessively etched by fluorine supplied from the polymers on the inner wall of the reaction chamber. Accordingly, after the oxide film has been etched, the surface of the substrate can be processed with oxygen plasma with a bias voltage applied to the substrate. Thus, if a contact hole is formed by etching an oxide film in accordance with the method of the present invention, a low-resistance, fine-line contact can be formed with good reproducibility.

In one embodiment of the present invention, the step of removing fluorine from the reaction chamber is changed into the step of performing oxygen plasma processing for removing polymers, remaining on the substrate, by applying a bias voltage to the electrode, supporting the substrate, while generating the oxygen plasma. In such an embodiment, both of these steps can be performed continuously and quickly while maintaining plasma in a stable state.

In another embodiment, the optical emission spectrum intensity of particular atoms or molecules contained in the oxygen plasma is measured and a time for applying a bias voltage is determined based on the optical emission spectrum intensity measured. In such an embodiment, processing can be performed efficiently in synchronism with the time fluorine has been removed from the reaction chamber.

In still another embodiment, the opening of a valve controlling the gas pressure inside the reaction chamber or the voltage of an electrode supporting the substrate is measured and a time for applying a bias voltage is determined based on the measured opening or voltage. In such an embodiment, processing can also be performed efficiently in synchronism with the time fluorine has been removed from the reaction chamber.

The method of the present invention includes the step of oxidizing a polymer film formed on the inner wall of a reaction chamber during plasma etching using a gas in which the ratio of fluorine to carbon is 2 or less. Since carbon in the polymer film reacts with oxygen, removed from the inner wall and exhausted, contact etching can be performed stably. Thus, even after the same etching process has been performed many times, it is possible to prevent any contact hole from having a defective opening.

Also, if the environment inside the reaction chamber is monitored based on the optical emission of $C_2$, oxygen or fluorine, then the thickness of the polymer film deposited on the inner wall of the reaction chamber can be sensed. In addition, the time taken to perform the step of controlling the environment inside the reaction chamber for removing or reducing polymers can be optimized.

What is claimed is:

1. A method for fabricating a semiconductor device, comprising the steps of:
   forming an oxide film on a substrate having a silicon region at least on the surface thereof;
   defining a resist pattern on the oxide film;
   placing the substrate on an electrode provided inside a reaction chamber of a plasma etching apparatus, and etching the oxide film by using plasma generated from a gas including a fluorocarbon gas, with a bias voltage applied to the substrate; and
   removing fluorine from the reaction chamber by generating oxygen plasma inside the reaction chamber with substantially no bias voltage applied to the substrate.

2. The method of claim 1, further comprising the step of performing oxygen plasma processing to remove polymer films, remaining on the substrate, with a bias voltage applied to the substrate, posterior to the step of removing fluorine.

3. The method of claim 2, wherein the step of removing fluorine is changed into the step of performing oxygen plasma processing by applying a bias voltage to the electrode while generating the oxygen plasma.

4. The method of claim 1, wherein the step of removing fluorine further comprises the step of supplying oxygen gas into the reaction chamber and controlling the pressure of the oxygen gas.

5. The method of claim 2, wherein in the step of removing fluorine, oxygen gas is supplied into the reaction chamber by increasing the amount thereof stepwise.

6. The method of claim 3, wherein an optical emission spectrum intensity of a particular atom or molecule contained in the oxygen plasma is measured, and a time for applying the bias voltage is determined based on the measured optical emission spectrum intensity.

7. The method of claim 6, wherein after the measured optical emission spectrum intensity has reached a value, a radio frequency voltage is applied to the electrode, thereby applying the bias voltage to the substrate.

8. The method of claim 6 or 7, wherein the particular atom is fluorine, carbon, oxygen, carbon oxide or carbon dioxide.

9. The method of claim 6 or 7, wherein the optical emission spectrum intensity is the intensity of light emitted from fluorine atoms at the wavelength of 685.6 nm.

10. The method of claim 3, wherein an opening of a valve controlling the pressure of a gas inside the reaction chamber is measured, and a time for applying the bias voltage is determined based on the measured opening.

11. The method of claim 10, wherein when the opening reaches a constant value, a radio frequency voltage is applied to the electrode, thereby applying the bias voltage to the substrate.

12. The method of claim 3, wherein a voltage of the electrode is measured, and a time for applying the bias voltage is determined based on the measured voltage.

13. The method of claim 12, wherein when the voltage decreases to reach a level, a radio frequency voltage is applied to the electrode, thereby applying the bias voltage to the substrate.

14. The method of one of claims 1 to 7, wherein in applying the bias voltage to the substrate, bias power having a power density of 8 $kW/m^2$ or less is applied to the electrode.

15. The method of one of claims 1 to 7, wherein the plasma etching apparatus is selected from the group consisting of: an inductively coupled plasma etching apparatus; a helicon wave plasma etching apparatus; an electron cyclotron resonance plasma etching apparatus; and a dual-frequency capacitively coupled plasma etching apparatus.

16. The method of one of claims 1 to 7, wherein the fluorocarbon gas is selected from the group consisting of: $CH_2F_2$; $CH_3F$; $C_2F_6$; $C_3F_8$; $C_4F_8$; and $C_5F_8$.

17. The method of one of claims 1 to 7, wherein the substrate is a silicon substrate.

18. The method of claim 17, wherein the step of etching the oxide film is a step of forming, in the oxide film, a contact hole reaching a silicide layer formed in the silicon substrate.

19. A method for fabricating a semiconductor device comprising the steps of:
   forming a semiconductor element on a substrate;
   depositing a silicon dioxide film on the substrate;
   defining a photoresist pattern on the silicon dioxide film;
   etching the silicon dioxide film by using gaseous plasma inside a reaction chamber of an etching apparatus, the ratio of fluorine to carbon contained in the gaseous plasma being two or less; and
   controlling an environment inside the reaction chamber by oxidizing a polymer film formed on an inner wall of the reaction chamber.

20. The method of claim 19, wherein the step of controlling the environment inside the reaction chamber comprises the step of performing oxygen plasma processing.

21. The method of claim 20, wherein the oxygen plasma processing is performed without supplying radio frequency power to the substrate.

22. The method of claim 19, further comprising the step of removing a polymer film formed on a substrate surface, posterior to the step of etching the silicon dioxide film.

23. The method of claim 19, further comprising the step of removing a polymer film formed on a substrate surface, posterior to the step of etching the silicon dioxide film and prior to the step of controlling the environment inside the reaction chamber.

24. The method of claim 19, further comprising the step of removing a polymer film formed on a substrate surface, posterior to the steps of etching the silicon dioxide film and controlling the environment inside the reaction chamber.

25. The method of one of claims 22 to 24, wherein the step of removing the polymer film formed on the substrate surface is performed with radio frequency power supplied to the substrate.

26. The method of claim 20 or 21, wherein the oxygen plasma processing is performed by supplying oxygen into the reaction chamber at a flow rate of 200 sccm or more and setting the pressure of a gas inside the reaction chamber at 20 mTorr or more.

27. The method of claim 20 or 21, wherein the oxygen plasma processing is performed by supplying carbon oxide and oxygen into the reaction chamber and setting the pressure of a gas inside the reaction chamber at 20 mTorr or more, a total flow rate of carbon oxide and oxygen being 200 sccm or more.

28. The method of one of claims 19 to 24, wherein the gas in which the ratio of fluorine to carbon is 2 or less contains molecules selected from the group consisting of: $C_4F_8$; $C_5F_8$; $C_3F_6O$; and $C_4F_6$.

29. The method of one of claims 19 to 24, further comprising the step of monitoring the environment inside the reaction chamber by using an optical emission of $C_2$, oxygen or fluorine inside the reaction chamber.

30. The method of claim 29, wherein the optical emission of $C_2$ is a signal at a wavelength of 516 nm.

31. The method of claim 29, wherein the optical emission of oxygen is a signal at a wavelength of 777 nm.

32. The method of claim 29, wherein the optical emission of fluorine is a signal at a wavelength of 704 nm or 685 nm.

33. The method of claim 19, wherein the step of controlling the environment inside the reaction chamber is performed posterior to the step of etching.

34. The method of claim 19, wherein the step of controlling the environment inside the reaction chamber is performed prior to the step of etching.

35. A method for controlling an environment inside a reaction chamber of a dry etching apparatus, the apparatus being used for performing the step of dry-etching a silicon dioxide film inside the reaction chamber by using gaseous plasma in which the ratio of fluorine to carbon is 2 or less, wherein oxygen plasma processing is performed on a polymer film formed on an inner wall of the reaction chamber while the step of dry etching is not performed.

* * * * *